United States Patent
Uehara et al.

(10) Patent No.: US 8,253,924 B2
(45) Date of Patent: Aug. 28, 2012

(54) EXPOSURE METHOD, EXPOSURE APPARATUS AND DEVICE MANUFACTURING METHOD

(75) Inventors: Yusaku Uehara, Ageo (JP); Kousuke Suzuki, Saitama (JP); Katsushi Nakano, Kumagaya (JP); Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 714 days.

(21) Appl. No.: 11/919,669

(22) PCT Filed: May 23, 2006

(86) PCT No.: PCT/JP2006/310218
§ 371 (c)(1),
(2), (4) Date: Oct. 31, 2007

(87) PCT Pub. No.: WO2006/126522
PCT Pub. Date: Nov. 30, 2006

(65) Prior Publication Data
US 2008/0218714 A1 Sep. 11, 2008

(30) Foreign Application Priority Data
May 24, 2005 (JP) .................................. 2005-151562

(51) Int. Cl.
*G03B 27/32* (2006.01)
*G03B 27/42* (2006.01)
*G03B 27/54* (2006.01)

(52) U.S. Cl. ............................... 355/67; 355/53; 355/77

(58) Field of Classification Search ............... 250/492.2; 355/30, 53, 55, 67, 72, 77; 430/30
See application file for complete search history.

(56) References Cited

U.S. PATENT DOCUMENTS

| 4,465,368 A | 8/1984 | Matsuura et al. |
| 5,448,332 A | 9/1995 | Sakakibara et al. |
| 5,493,403 A | 2/1996 | Nishi |
| 5,646,413 A | 7/1997 | Nishi |
| 5,825,043 A | 10/1998 | Suwa |
| 5,883,704 A | 3/1999 | Nishi et al. |
| 5,969,441 A | 10/1999 | Loopstra et al. |
| 6,208,407 B1 | 3/2001 | Loopstra |

(Continued)

FOREIGN PATENT DOCUMENTS
EP 1 524 558 A1 4/2005

(Continued)

OTHER PUBLICATIONS

Kunz et al Transparent fluids for 157-nm immersion lithography J. Microlith., Microfab., Microsyst., vol. 3 No. 1, Jan. 2004.*

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

An exposure apparatus is provided with an optical system including a liquid, a sensor system for acquiring energy information of an energy beam which is incident on the liquid, and a controller which predicts variation of optical properties of the optical system including the liquid due to energy absorption of the liquid based on the energy information acquired using the sensor system and controls exposure operation with respect to an object based on the prediction results. According to the exposure apparatus, exposure operation without being influenced by the variation of the optical properties of the optical system including the liquid due to the energy absorption of the liquid becomes possible.

43 Claims, 6 Drawing Sheets

U.S. PATENT DOCUMENTS

| | | | |
|---|---|---|---|
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,563,567 B1 | 5/2003 | Komatsuda et al. | |
| 6,590,634 B1 | 7/2003 | Nishi et al. | |
| 6,636,350 B2 | 10/2003 | Shafer et al. | |
| 6,778,257 B2 | 8/2004 | Bleeker et al. | |
| 6,873,476 B2 | 3/2005 | Shafer | |
| 6,897,963 B1 | 5/2005 | Taniguchi et al. | |
| 2002/0061469 A1 | 5/2002 | Tanaka | |
| 2003/0197849 A1* | 10/2003 | Ishikawa et al. | 355/69 |
| 2004/0160666 A1 | 8/2004 | Hudyma | |
| 2005/0078286 A1 | 4/2005 | Dierichs et al. | |
| 2005/0094116 A1 | 5/2005 | Flagello et al. | |
| 2005/0094119 A1 | 5/2005 | Loopstra et al. | |
| 2005/0179877 A1 | 8/2005 | Mulkens et al. | |
| 2005/0259234 A1 | 11/2005 | Hirukawa et al. | |
| 2006/0082744 A1* | 4/2006 | Hirukawa | 355/30 |
| 2006/0098179 A1 | 5/2006 | Hirukawa | |
| 2006/0114437 A1* | 6/2006 | Akhssay et al. | 355/55 |
| 2006/0132737 A1* | 6/2006 | Magome et al. | 355/53 |
| 2006/0164616 A1* | 7/2006 | Okada | 355/53 |
| 2007/0211233 A1* | 9/2007 | Van De Kerkhof et al. | 355/30 |
| 2008/0309896 A1 | 12/2008 | Hirukawa | |
| 2009/0021707 A1 | 1/2009 | Mulkens et al. | |
| 2009/0021709 A1* | 1/2009 | Nagasaka | 355/53 |
| 2009/0104568 A1 | 4/2009 | Hirukawa | |
| 2009/0280439 A1* | 11/2009 | Shibazaki | 430/325 |
| 2010/0265476 A1 | 10/2010 | Dierichs et al. | |

FOREIGN PATENT DOCUMENTS

| | | |
|---|---|---|
| EP | 1 628 330 A1 | 2/2006 |
| EP | 1 806 773 A1 | 7/2007 |
| JP | A-57-117238 | 7/1982 |
| JP | A-04-065603 | 3/1992 |
| JP | A-06-053120 | 2/1994 |
| JP | A-06-124873 | 5/1994 |
| JP | A-06-188169 | 7/1994 |
| JP | A-06-252022 | 9/1994 |
| JP | A-06-283403 | 10/1994 |
| JP | A-07-176468 | 7/1995 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-016816 | 1/1999 |
| JP | A-2000-505958 | 5/2000 |
| JP | A-2000-164504 | 6/2000 |
| JP | A-2004-193252 | 7/2004 |
| JP | A-2005-012201 | 1/2005 |
| JP | A-2005-051147 | 2/2005 |
| JP | A-2005-093997 | 4/2005 |
| JP | A-2005-116570 | 4/2005 |
| JP | A-2006-210858 | 8/2006 |
| JP | A-2006-303193 | 11/2006 |
| WO | WO 01/35168 A1 | 5/2001 |
| WO | WO 2004/053955 A1 | 6/2004 |
| WO | WO 2004/107417 A1 | 12/2004 |
| WO | WO 2005010962 A1 * | 2/2005 |
| WO | WO 2005031823 A1 * | 4/2005 |

OTHER PUBLICATIONS

Notification of Reasons for Refusal for Japanese Application No. 2007-517829; mailed Jun. 2, 2010 (with translation).

Notice of Grant for Application No. 2007-517829; mailed Aug. 25, 2010 (with translation).

Feb. 7, 2011 Supplementary European Search Report for European Patent Application No. 06756474.

* cited by examiner

EXPOSURE METHOD, EXPOSURE APPARATUS AND DEVICE MANUFACTURING METHOD

TECHNICAL FIELD

The present invention relates to exposure methods, exposure apparatus, and device manufacturing methods, and more particularly to an exposure method and an exposure apparatus used in a lithography process to produce electronic devices such as a semiconductor device (an integrated circuit) or a liquid crystal display device, and a device manufacturing method that uses the exposure method and the exposure apparatus.

BACKGROUND ART

Conventionally, in a lithographic process to produce electronic devices such as a semiconductor (integrated circuit) or a liquid crystal display device, the reduction projection exposure apparatus based on a step-and-repeat method (the so-called stepper) that transfers an image of a pattern of a mask (or a reticle) via a projection optical system onto each of a plurality of shot areas on a sensitive object such as a wafer, a glass plate or the like (hereinafter generally referred to as a "wafer"), on which a resist (sensitive agent) is coated, the projection exposure apparatus based on a step-and-scan method by (the so-called scanning stepper (also called a scanner) and the like are mainly used.

With these types of projection exposure apparatus, a higher resolving power (resolution) is required year by year due to finer patterns according to higher integration of the integrated circuits, and in recent years, exposure apparatus that use the liquid immersion method are beginning to gather attention. As an exposure apparatus that uses the liquid immersion method, an exposure apparatus that performs exposure in a state where the space between the lower surface of a projection optical system and the surface of a wafer is filled locally with liquid such as water, an organic solvent or the like is known (e.g. refer to Patent Document 1). In the exposure apparatus according to Patent Document 1, the resolution is improved by the use of the fact that the wavelength of the exposure light in the liquid becomes 1/n of the wavelength in the air (n is the refractive index of the liquid which is normally around 1.2 to 1.6), and the depth of focus is also substantially enlarged n times than in the air.

Now, in the liquid immersion exposure apparatus, the optical properties (e.g. aberration) of the entire optical system including the projection optical system and the liquid (e.g. water) may fluctuate due to a refractive index change of the liquid by irradiation of an exposure light.

Further, transmittance of the liquid to the exposure light may fluctuate by the liquid coming into contact with the atmosphere. For example, the transmittance of the liquid may decrease by TOC (Total Organic Carbon) in the liquid and/or the increase of dissolved oxygen amount in the liquid.

As a consequence, it may become difficult to maintain or to secure the aberration acceptable, the various precisions required and the like in the exposure apparatus.

Patent Document 1: Kokai (Japanese Patent Unexamined Application Publication) No. 6-252022 bulletin

DISCLOSURE OF THE INVENTION

Means for Solving the Problems

The present invention was made under the circumstances described above, and according to a first aspect of the present invention is provided a first exposure method in which an energy beam is irradiated on an object via an optical system including a liquid and the object is exposed, the method comprising: a process in which a variation of optical properties of the optical system due to energy absorption of the liquid is predicted, based on energy information of the energy beam which is incident on the liquid; and a process in which exposure operation of the object is performed, based on a result of the prediction.

According to this method, it becomes possible to execute the exposure operation while suppressing the influence of variation of the optical properties of the optical system including the liquid caused by the energy absorption of the liquid.

According to a second aspect of the present invention, there is provided a second exposure method in which an energy beam is irradiated on an object via a liquid and the object is exposed, wherein the object is exposed while an integrated exposure amount to the object is controlled, based on a variation of physical quantities associated with transmittance of the liquid to the energy beam.

According to this method, even if the transmittance of the liquid fluctuates, it becomes possible to expose the object while suppressing the influence of the transmittance fluctuation.

In a lithography process, by exposing an object to form a device pattern on the object using the exposure method according to one of the first and second exposure methods, it becomes possible to form a device pattern on an object with good precision. Therefore, according to a third aspect of the present invention, it can be said that there is provided a device manufacturing method in which one of the first and second exposure methods of the present invention is used.

According to a fourth aspect of the present invention, there is provided a first exposure apparatus that irradiates an energy beam on an object via a liquid and exposes the object, the apparatus comprising: an optical system that includes the liquid; a sensor system that acquires energy information of the energy beam incident on the liquid; and a control unit that performs prediction of a variation of the optical properties of the optical system including the liquid due to energy absorption of the liquid based on the energy information acquired using the sensor system, and controls exposure operation to the object, based on a result of the prediction.

According to this apparatus, it becomes possible to execute the exposure operation while suppressing the influence of variation of the optical properties of the optical system including the liquid caused by the energy absorption of the liquid.

According to a fifth aspect of the present invention, there is provided a second exposure apparatus that exposes an object by irradiating an energy beam on an object via a liquid, the apparatus comprising: a beam source that emits the energy beam; and a control unit that controls an integrated exposure amount to the object based on a variation of physical quantities associated with the transmittance of the liquid to an energy beam emitted from the beam source when the object is exposed.

According to this method, even if the transmittance of the liquid fluctuates, it becomes possible to expose the object while suppressing the influence of the transmittance fluctuation.

In a lithography process, by exposing an object to form a device pattern on the object using the exposure apparatus according to one of the first and second exposure apparatus, it becomes possible to form a device pattern on an object with good precision. Therefore, according to a sixth aspect of the present invention, it can also be said that the present invention is a device manufacturing method using one of the first and the second exposure apparatus of the present invention.

According to a seventh aspect of the present invention, there is provided a device manufacturing method including a lithography process in which an object is exposed by irradiating an energy beam on the object via an optical system including a liquid to form a device pattern on the object, the method comprising: a process in which a variation of optical properties of the optical system due to energy absorption of the liquid is predicted, based on energy information of the energy beam which is incident on the liquid; and a process in which exposure operation of the object is performed, based on a result of the prediction.

According to this method, it becomes possible to execute the exposure operation while suppressing the influence of variation of the optical properties of the optical system including the liquid caused by the energy absorption of the liquid, and it becomes possible to form a device pattern on an object with good precision.

According to an eighth aspect of the present invention, there is provided a device manufacturing method including a lithography process in which an object is exposed by irradiating an energy beam on the object via a liquid to form a device pattern on the object, the method comprising: a process in which the energy beam is discharged from a beam source; and a process in which the object is exposed while an integrated exposure amount to the object is controlled, based on a variation of physical quantities associated with transmittance of the liquid to the energy beam.

According to this method, even if the transmittance of the liquid fluctuates, it becomes possible to expose the object while suppressing the influence of the transmittance fluctuation, and it becomes possible to form a device pattern on an object with good precision.

According to a ninth aspect of the present invention, there is provided a device manufacturing method including a lithography process in which an object is exposed by irradiating an energy beam on the object via an optical system including a liquid to form a device pattern on the object, the method comprising: a process in which energy information of the energy beam which is incident on the liquid is acquired, using a sensor system; a process in which a variation of optical properties of the optical system including the liquid due to energy absorption of the liquid is predicted based on the energy information acquired using the sensor system; and a process in which exposure operation of the object is performed, based on a result of the prediction.

According to this method, it becomes possible to execute the exposure operation while suppressing the influence of variation of the optical properties of the optical system including the liquid caused by the energy absorption of the liquid, and it becomes possible to form a device pattern on an object with good precision.

According to a tenth aspect of the present invention, there is provided a device manufacturing method including a lithography process in which an object is exposed by irradiating an energy beam on the object via an optical system including a liquid to form a device pattern on the object, the method comprising: a process in which the energy beam is emitted from a beam source; and a process in which the object is exposed by the energy beam from the beam source, while an integrated exposure amount to the object is controlled based on a variation of physical quantities associated with transmittance of the liquid to the energy beam emitted from the beam source.

According to this method, even if the transmittance of the liquid fluctuates, it becomes possible to expose the object while suppressing the influence of the transmittance fluctuation, and it becomes possible to form a device pattern on an object with good precision.

BEST MODE FOR CARRYING OUT THE INVENTION

Hereinafter, an embodiment of the present invention will be explained, referring to FIGS. 1 to 6D.

Figure 1:
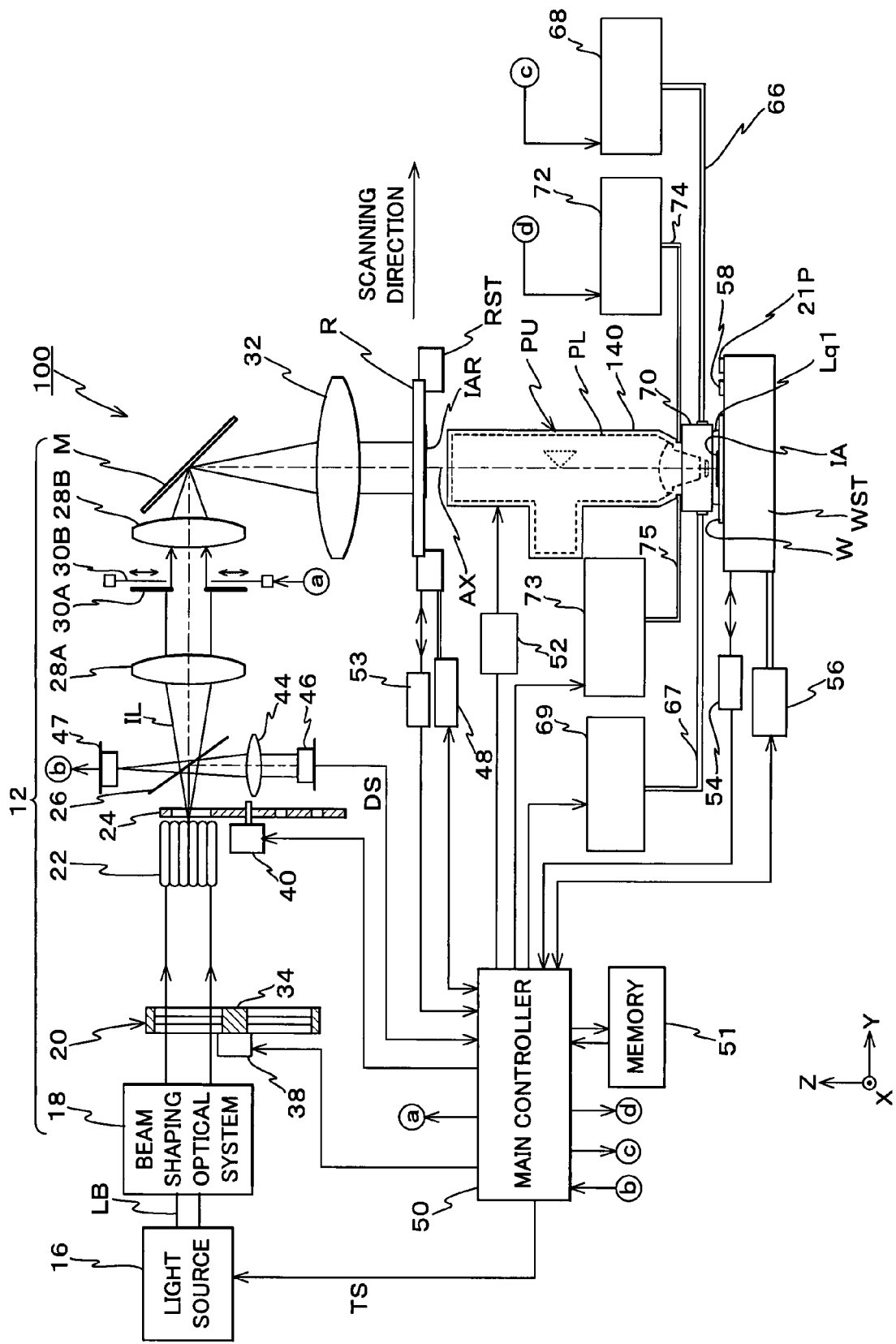
FIG. 1 is a view that shows a schematic configuration of an exposure apparatus of an embodiment.

FIG. 1 shows a schematic configuration of an exposure apparatus 100 related to an embodiment.

Exposure apparatus 100 is a scanning exposure apparatus of the step-and-scan method, namely the so-called scanner.

Exposure apparatus 100 is equipped with an illumination system including a light source 16 and an illumination optical system 12, a reticle stage RST on which a reticle R illuminated by an illumination light IL serving as an energy beam for exposure emitted from the illumination system is held and moves in a predetermined scanning direction (in this case, the direction is to be a Y-axis direction, which is the lateral direction on the page surface in FIG. 1), a projection unit PU including a projection optical system PL which projects a pattern of reticle R on a wafer W, a wafer stage WST that moves within a horizontal surface (in an XY plane) while holding wafer W, a liquid immersion mechanism, and a control system for controlling these sections.

As light source 16, as an example, an ArF excimer laser (output wavelength 193 nm) is used, which is a pulsed light source that generates light in the vacuum ultraviolet region having a wavelength of 200 nm to 170 nm.

Illumination optical system 12 includes a beam shaping optical system 18, a rough energy adjuster 20, an optical integrator (a uniformizer or a homogenizer) 22, an illumination system aperture stop plate 24, a beam splitter 26, a first relay lens 28A, a second relay lens 28B, a fixed reticle blind 30A, a movable reticle blind 30B, a mirror M for optical path bending, a condensing lens 32 and the like, which are placed in a predetermined positional relation. Incidentally, as optical integrator 22, a fly-eye lens, an internal reflection type integrator, a diffractive optical element or the like can be used, however, because a fly-eye lens is used in FIG. 1, optical integrator 22 will also be referred to as a "fly-eye lens" in the description below.

Rough energy adjuster 20 is disposed on an optical path of a laser beam LB, behind beam shaping optical system 18, which shapes the cross-sectional shape of laser beam LB entering from light source 16. Rough energy adjuster 20 has a revolving plate (revolver) 34 in which a plurality of (e.g., six) ND filters (in FIG. 1, only two ND filters are shown) with a different transmittance (=1−attenuation ratio) is disposed along a circumferential direction at a predetermined distance, and by rotating the revolving plate 34 with a drive motor 38, the transmittance to laser beam LB that enters can be switched from 100% in a plurality of steps. Drive motor 38 is controlled by main controller 50. Incidentally, rough energy adjuster 20 can be configured of a two-stage revolver having a plurality of ND filters, or a one-stage or a multi-stage filter switching member having a plurality of mesh filters or the like of different transmittance.

Behind rough energy adjuster 20, illumination system aperture stop plate 24 consisting of a disc-like member is placed via fly-eye lens 22. In illumination system aperture stop plate 24, at a substantially equal angle, for example, a conventional aperture stop made up of a circular aperture (conventional aperture), an aperture stop made up of small circular apertures to reduce a σ value, which is a coherence factor (small σ aperture), a ring-shaped aperture stop for annular illumination (ring-shaped aperture), and a modified aperture stop made up of a plurality of apertures arranged eccentrically for a modified light source method, are arranged (only two types of the aperture stops are shown in FIG. 1). Illumination system aperture stop plate 24 is rotated by a drive unit 40 such as a motor controlled by main controller 50. Accordingly, one of the aperture stops is set selectively on an optical path of illumination light IL.

Incidentally, in the embodiment, the illumination condition is changed using illumination system aperture stop plate 24, however, the optical element (optical system) for changing the illumination condition is not limited to this.

The illumination condition can be changed using an optical system disclosed in, for example, U.S. Pat. No. 6,563,567 description. As long as the national laws in designated states (or elected states), to which this international application is applied, permit, the above disclosure of the U.S. patent is incorporated herein by reference.

On an optical path of illumination light IL behind illumination system aperture stop plate 24, beam splitter 26 that has a small reflectivity and a large transmittance is placed, and further downward on the optical path, a relay optical system including the first relay lens 28A and the second relay lens 28B is placed, with fixed reticle blind (fixed field stop) 30A and movable reticle blind (movable field stop) 30B arranged in between.

Fixed reticle blind 30A is placed on a surface which is slightly defocused from a conjugate surface with respect to the pattern surface of reticle R, and a rectangular opening is formed that sets an illumination area IAR on reticle R. Further, in the vicinity of fixed reticle blind 30A, movable reticle blind 30B having a variable opening section is placed, and by using movable reticle blind 30B at the beginning and the end of scanning exposure so as to further limit illumination area IAR, unnecessary exposure is prevented.

On the optical path of illumination light IL behind the second relay lens 28B, bending mirror M is placed which reflects illumination light IL having passed through the second relay lens 28B toward reticle R, and on the optical path of illumination light IL behind mirror M, condensing lens 32 is placed.

Meanwhile, illumination light IL reflected off one of the surfaces (the surface) of beam splitter 26 is received by an integrator sensor 46 consisting of a photoelectric conversion element via condensing lens 44, and a photoelectric conversion signal of integrator sensor 46 is supplied to main controller 50 as output DS (digit/pulse) via a hold circuit (not shown), an A/D converter and the like.

As integrator sensor 46, for example, a PIN type photodiode or the like that has sensitivity in the far ultraviolet region and the vacuum ultraviolet region, and also has high response frequency for detecting pulsed light from light source 16 can be used.

Further, in order to receive the light reflected off the other surface (the rear surface) of beam splitter 26, a reflection monitor 47 made up of a photoelectric conversion element is placed at a position conjugate to a pupil plane of illumination optical system 12. In the embodiment, illumination light IL (reflection light) reflected off wafer W returns to beam splitter 26 via projection optical system PL, condensing lens 32, mirror M, and the relay optical system, and the light reflected off beam splitter 26 is received by reflection amount monitor 47 and detection signals of reflection amount monitor 47 is supplied to main controller 50. Reflection amount monitor 47 is used for measuring the wafer reflectivity, which is the base for calculating the change in image-forming characteristics (various aberrations) caused by illumination light absorption by the optical system, or the so-called irradiation variation.

Accordingly, during the exposure, light quantity (a first light quantity) of illumination light IL, which passes through projection optical system PL and a liquid Lq1 filled in the space between projection optical system PL and wafer W via reticle R, is monitored by the output signals of integrator sensor 46, whereas light quantity (a second light quantity) of the reflection light, which is reflected off wafer W and passes through liquid Lq1 and projection optical system PL again, can be monitored by the detection signals of reflection amount monitor 47. Therefore, based on the first light quantity and the second light quantity, the total light quantity of light that passes through projection optical system PL and liquid Lq1 can be monitored more precisely. As it will be described later in the description, in the embodiment, a liquid Lq2 (refer to FIG. 2) is to be filled in the space between an optical element that constitutes projection optical system PL closest to the image plane and an optical element adjacent to the optical element closest to the image plane, however, in the description above, liquid Lq2 is viewed as a part of an optical element that constitutes projection optical system PL, therefore, in this case, only liquid Lq1 is described separately from projection optical system PL.

On reticle stage RST, reticle R is mounted, and held by suction using a vacuum chuck or the like (not shown). Reticle stage RST can be finely driven within a horizontal plane (an XY plane), for example, by a reticle stage drive system 48 of a linear motor method, and is also scanned in the scanning direction (in this case, the Y-axis direction, which is the lateral direction of the page surface of FIG. 1) within a predetermined stroke range. The position of reticle stage RST is measured using a side surface (reflection surface) of reticle stage RST that has been mirror-polished, by a reticle laser interferometer 53 externally arranged, and the measurement values of reticle laser interferometer 53 are supplied to main controller 50.

In this embodiment, as is shown in FIG. 1, projection unit PU is placed below reticle stage RST. Projection unit PU includes a barrel 140, and projection optical system PL that has a plurality of optical elements which are held in a predetermined positional relation inside barrel 140. Further, in the embodiment, a catodioptric system is used as projection optical system PL.

In exposure apparatus 100 of the embodiment, since exposure is performed applying the liquid immersion method as is described later in the description, the opening on the reticle side becomes larger with the substantial increase of the numerical aperture NA. Therefore, in a dioptric system consisting only of lenses, it becomes difficult to satisfy the Petzval condition, which tends to lead to an increase in the size of the projection optical system. The catodioptric system was employed as projection optical system PL, in order to prevent such an increase in the size of the projection optical system.

Figure 4:
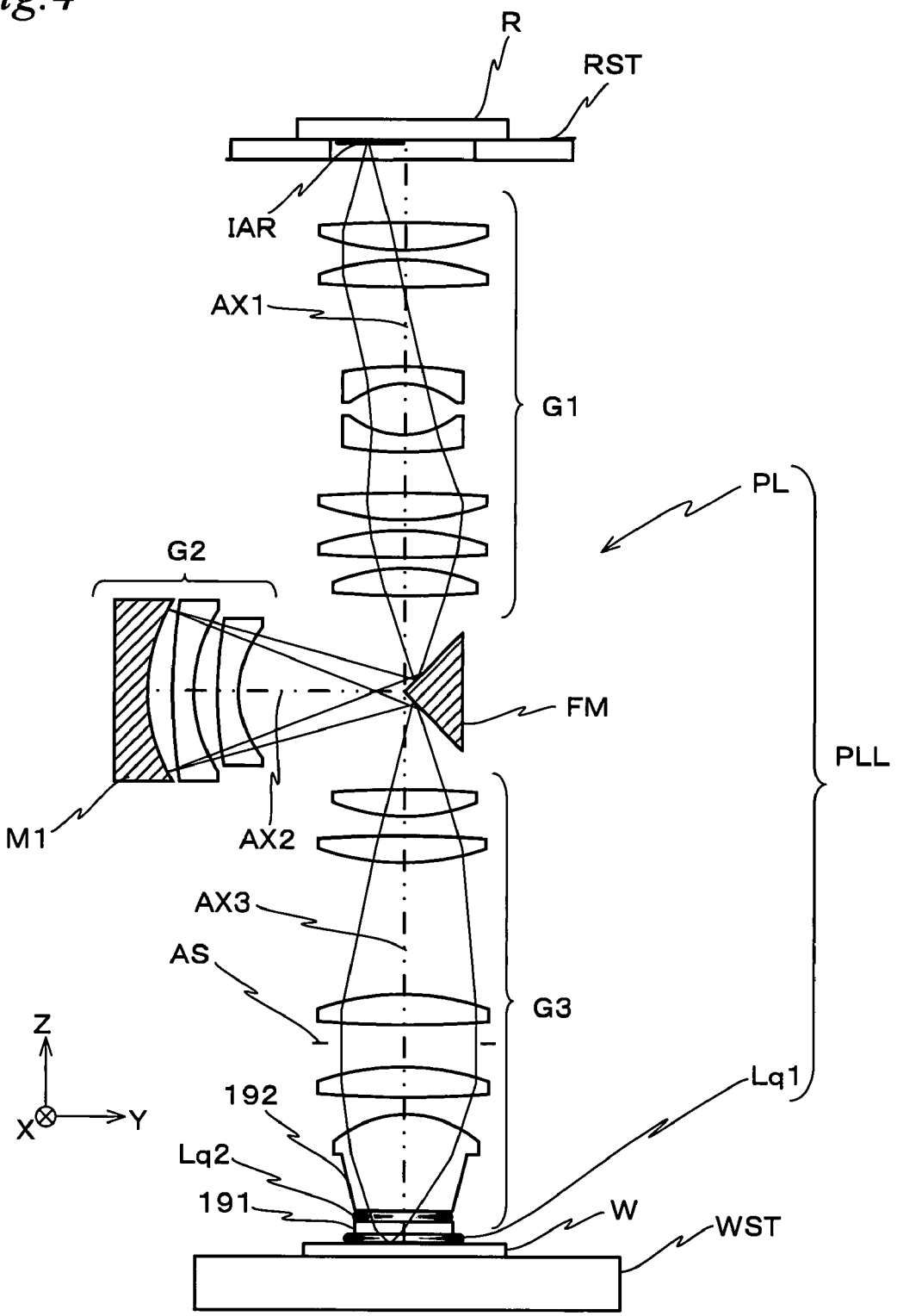
FIG. 4 is a view that shows a configuration of a projection optical system.
Figure 5:
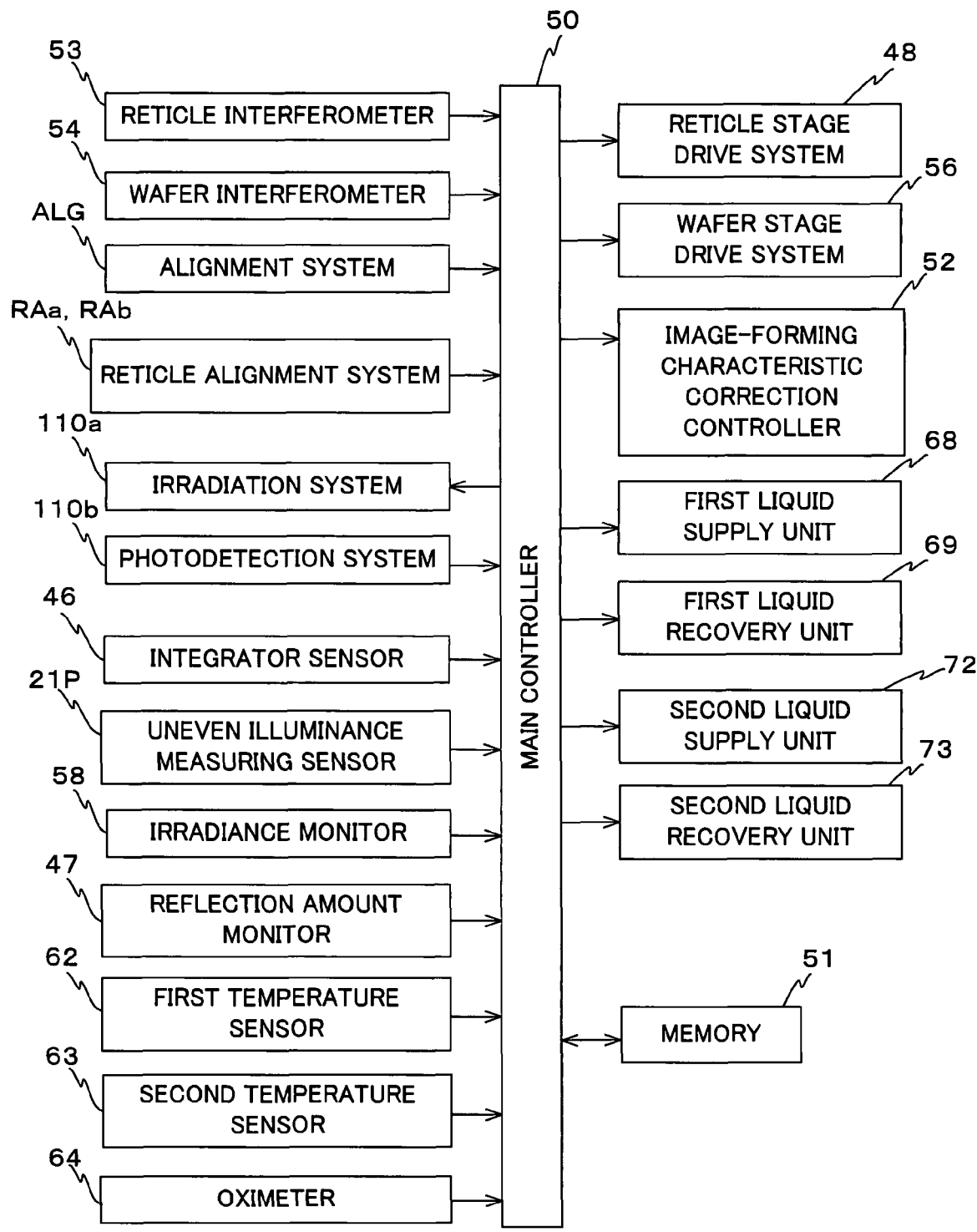
FIG. 5 is a block diagram that shows the main part of a control system of the apparatus in FIG. 1.

FIG. 4 shows an example of an arrangement of projection optical system PL, along with reticle R (reticle stage RST) and wafer W (wafer stage WST). Projection optical system PL includes three image-forming optical systems G1, G2, G3, and the like placed at a predetermined positional relation within barrel 140, and as a whole, the system is a reduction optical system (the projection magnification is, for example, ¼, ⅕, or ⅛).

Projection optical system PL is equipped with a first image-forming optical system G1 of a refraction type that forms a primary image of the pattern formed on reticle R, a second image-forming optical system G2 of catodioptric type that forms a secondary image by re-imaging the primary image, and a third image-forming optical system G3 that forms a final image by re-imaging the secondary image on the wafer.

On the optical path in between the first image-forming optical system G1 and the second image-forming optical system G2, and the optical path in between the second image-forming optical system G2 and the third image-forming optical system G3, an optical path bending mirror FM is placed. An optical axis AX1 of the first image-forming optical system G1 and an optical axis AX3 of the third image-forming optical system G3 share an axis, and the optical axes AX1 and AX3 and an optical axis AX2 of the second image-forming optical system G2 intersect at one point. And, at this intersecting point, a virtual vertex (ridge line) of the two reflection surfaces that optical path bending mirror FM has is positioned.

In projection optical system PL, because a concave reflection mirror M1 that constitutes a part of the second image-forming optical system G2 contributes to the Petzval sum in the same manner as a negative lens while having a positive refracting power, the Petzval sum can be corrected easily by the combination of concave reflection mirror M1 and a positive lens, which allows curvature of image plane to be favorably corrected. Accordingly, spherical aberration and coma can be favorably corrected in the entire effective imaging area (effective exposure area) even when numerical aperture NA on the image side is large. And, one or more negative lenses is placed inside the second image-forming optical system G2, and in cooperation of such negative lenses and concave reflection mirror M1, chromatic aberration that occurs in the first image-forming optical system G1 and the third image-forming optical system G3 is compensated.

Figure 3:
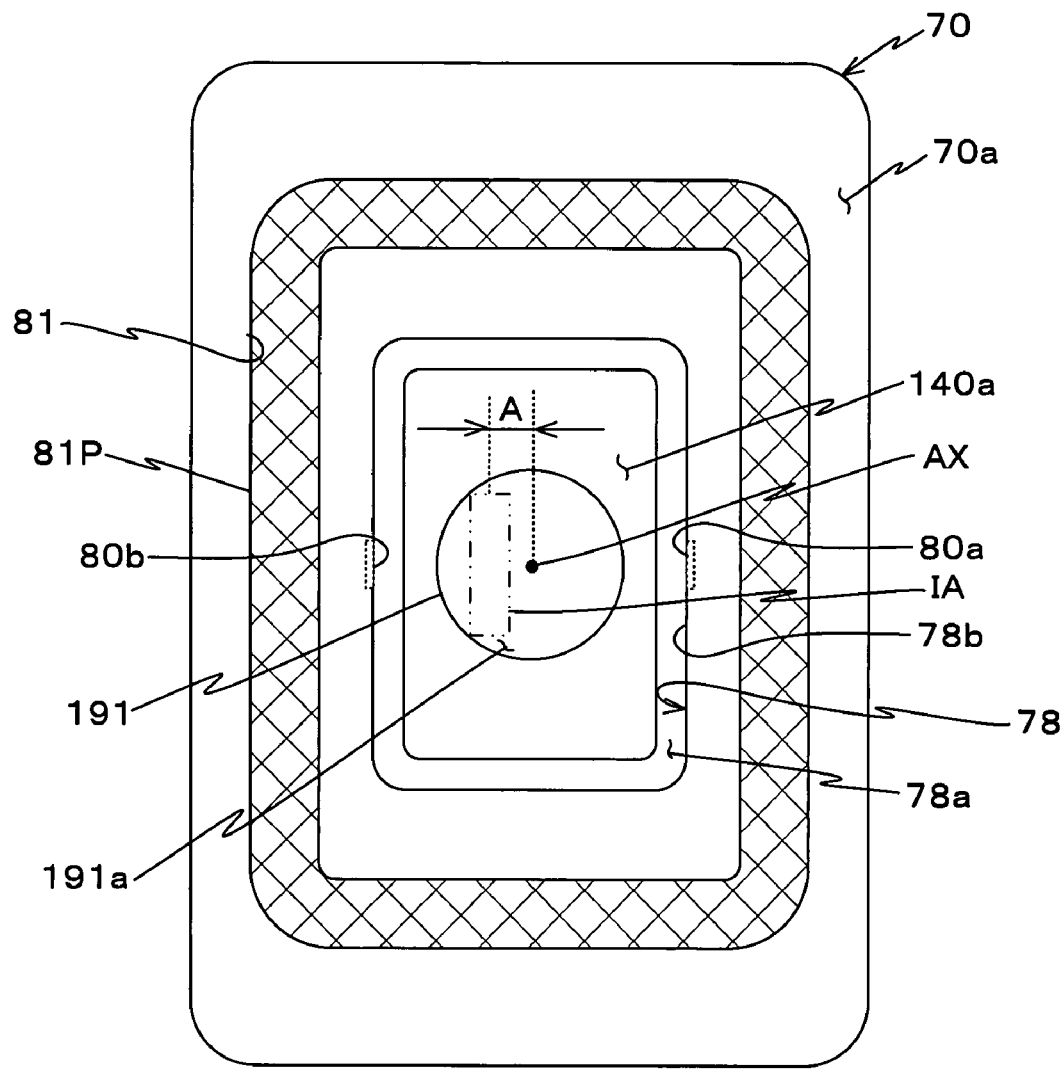
FIG. 3 is a view that shows a nozzle member when viewed from the bottom.

In the case of using a catodioptric system such as projection optical system PL, the problem of how to separate the light that proceeds toward concave reflection mirror M1 and the returning light that is reflected off concave reflection mirror M1 occurs. Projection optical system PL of the embodiment has an effective exposure area (effective imaging area) IA that is decentered only by a distance A on the −Y side of optical axis AX (that is, optical axes AX1 and AX3) as is shown in FIG. 3, and forms two intermediate images on the optical path. Then, in the vicinity of the two intermediate images, a flat reflection mirror for separating the optical path, or in other words, the two reflection surfaces of optical path bending mirror FM, is disposed, so as to easily separate the light proceeding toward concave reflection mirror M1 and the returning light reflected off concave reflection mirror M1. This configuration allows distance A of exposure area (that is, effective exposure area) IA from optical axis AX, that is, the axis decentered amount, to be set small. This is advantageous not only from the point of the aberration correction, but also from the point of decreasing the size of projection optical system PL, optical adjustment, mechanical design, production cost, and the like. And, by forming the two intermediate images on the concave reflection mirror M1 side of optical path bending mirror FM, the axis decentered amount can be set smaller.

Further, on reticle R, corresponding to the decentering of effective exposure area IA described above, a rectangular-shaped illumination area (that is, effective illumination area) IAR that has the size and shape corresponding to effective exposure area IA is formed (refer to FIG. 4) at a position a predetermined distance away from optical axis AX in the −Y direction, the distance corresponding to axis decentered amount A.

Of the plurality of optical elements of projection optical system PL, a border lens 192 (hereinafter also appropriately referred to as 'optical element 192'), which is disposed closest to the wafer except for an end optical element 191, has a convex surface that faces the reticle side. That is, the surface of boarder lens 192 on the reticle side has a positive refracting power. And, on the optical path between border lens 192 and wafer W, end optical element 191 consisting of a parallel plane plate is placed. Furthermore, the optical path between border lens 192 and end optical element 191 and the optical path between end optical element 191 and wafer W are filled with liquid whose refractive index is larger than 1.1. In the embodiment, each optical path is filled with purified water whose refractive index to the ArF excimer laser beam, that is, illumination light IL having the wavelength of 193 nm, is 1.44. The purified water can transmit, not only the ArF excimer laser beam, but also, for example, bright lines in the ultraviolet region emitted from a mercury lamp (such as the g-line, the h-line, and the i-line) and deep ultraviolet light (DUV light) such as the KrF excimer laser beam (wavelength 248 nm).

In the embodiment, of the plurality of lenses of projection optical system PL, for example, a plurality of specific lenses, such as a plurality of lenses (e.g. five) (hereinafter also referred to as 'movable lenses') in a plurality of lenses included in the first image-forming optical system G1, is driven by an image-forming characteristics correction controller 52 shown in FIG. 1, based on instructions from main controller 50, and the optical properties (including image-forming characteristics) of the optical system including projection optical system PL such as magnification, distortion, coma, and curvature of image plane (including inclination of image plane) and the like can be adjusted.

As is shown in FIG. 1, wafer stage WST is placed below projection optical system PL above a base (not shown), and is moved freely by a wafer stage drive system 56 including linear motors, within an XY plane (including a θz rotation). Further, wafer stage WST is finely moved in a Z-axis direction and a direction of inclination with respect to the XY plane (rotation direction around the X-axis (θx direction) and the rotation direction around the Y-axis (θy direction)) by an actuator, which is a part of wafer stage drive system 56. Wafer stage drive system 56 can also be equipped with an actuator that finely moves wafer stage WST within the XY plane, in addition to the actuator which drives wafer stage WST in the Z-axis direction and the direction of inclination with respect to the XY plane.

The position and the rotation (yawing (the θz rotation, which is the rotation around the Z-axis), pitching (the θx rotation, which is the rotation around the X-axis), and rolling (the θy rotation, which is the rotation around the Y-axis)) of wafer stage WST within the XY plane is detected constantly by a wafer laser interferometer 54, using a reflection surface arranged in wafer stage WST.

The position information (or speed information) on wafer stage WST is supplied to main controller 50. Main controller 50 controls wafer stage WST according to the position information (or speed information), via wafer stage drive system 56.

At a predetermined position on wafer stage WST, a fiducial member (not shown) that has a plurality of fiduciary marks is arranged. Further, in the vicinity of wafer W on wafer stage WST an uneven illuminance measuring sensor 21P as in the one disclosed in, for example, Kokai (Japanese Unexamined Patent Application Publication) No. 57-117238 and the corresponding U.S. Pat. No. 4,465,368 or the like, is arranged. The photodetection surface of uneven illuminance measuring sensor 21P is set to the same height as the surface of wafer W, and a pinhole-shaped photodetection section (not shown) is formed. Furthermore, on wafer stage WST, an irradiance monitor 58 on which a photodetection surface larger than exposure area IA is formed, such as the one disclosed in, for example, Kokai (Japanese Patent Unexamined Application Publication) No. 11-16816 bulletin and the corresponding U.S. Patent Application No. 2002/0061469, is installed in a state where its photodetection surface is positioned substantially coplanar with the surface of wafer W. By irradiance monitor 58 and uneven illuminance measuring sensor 21P, the illumination light IL which has passed through projection optical system PL can be received on the image plane or on the neighboring plane of projection optical system PL. As long as the national laws in designated states (or elected states), to which this international application is applied, permit, the above disclosures of the Kokai publications, the U.S. patent, and the U.S. application are incorporated herein by reference.

As irradiance monitor 58 and uneven illuminance measuring sensor 21P, photoelectric conversion elements such as a photodiode or a photomultiplier that is sensitive to the same wavelength range as illumination light IL (for example, wavelength around 300 to 100 nm) and has high response frequency for detecting illumination light IL can be used. Detection signals (photoelectric conversion signals) of irradiance monitor 58 and uneven illuminance measuring sensor 21P are supplied to main controller 50 via a hold circuit and an analog-digital (A/D) converter (not shown), and the like.

In the vicinity (e.g. on the +Y side) of projection unit PU, an off axis alignment system (hereinafter referred to as "alignment system" for short) ALG (not shown in FIG. 1, refer to FIG. 5) that optically detects marks subject to detection such as alignment marks or the like on wafer W is arranged. Incidentally, as alignment system ALG, sensors of various methods can be used, however, in the embodiment, a sensor by the image processing method is used. Incidentally, details on the sensor by the image processing method are disclosed in, for example, Kokai (Japanese Patent Unexamined Application Publication) No. 4-65603 bulletin and the corresponding U.S. Pat. No. 5,493,403 specification and the like, therefore, a detailed explanation will be omitted here. The imaging signals from alignment system ALG are supplied to main controller 50 (refer to FIG. 5). As long as the national laws in designated states (or elected states), to which this international application is applied, permit, the above disclosures of the publication and the U.S. patent are incorporated herein by reference.

Further, although it is not shown in FIG. 1, above reticle R, a pair of TTR (Through The Reticle) alignment systems RAa and RAb (refer to FIG. 5), which uses light of the exposure wavelength to observe via projection optical system PL a positional relation between a pair of reticle alignment marks on reticle R and a corresponding pair of fiducial marks arranged on the fiducial member on wafer stage WST, are arranged in the X-axis direction at a predetermined distance. As such reticle alignment detection systems RAa and RAb, a system having a structure similar to the one disclosed in, for example, Kokai (Japanese Patent Unexamined Application Publication) No. 7-176468 bulletin and the corresponding U.S. Pat. No. 5,646,413 specification or the like is used. As long as the national laws in designated states (or elected states), to which this international application is applied, permit, the above disclosures of the publication and the U.S. patent are incorporated herein by reference.

Referring back to FIG. 1, the liquid immersion mechanism is equipped with a first liquid supply unit 68, a second liquid supply unit 72, a first liquid recovery unit 69, a second liquid recovery unit 73, a nozzle member 70, and a piping system and the like connecting each section.

Nozzle member 70 is an annular member that is arranged above wafer W (wafer stage WST) so that it surrounds the lower end section of barrel 140. Nozzle member 70 is supported by a main column (not shown), which holds projection unit PU via a vibration isolation unit (not shown), via a support member (not shown).

The first liquid supply unit 68 connects to nozzle member 70 via a supply pipe 66. The first liquid supply unit 68 supplies liquid Lq1 to a first space K1 (refer to FIG. 2) between end optical element 191 (refer to FIG. 2) closest to the image plane of projection optical system PL and wafer W (wafer stage WST) via supply pipe 66. This first liquid supply unit 68 includes a tank for holding liquid Lq1, a temperature adjustment unit for adjusting the temperature of liquid Lq1 that is to be supplied, a filtering unit for removing foreign materials in liquid Lq1, a compression pump, a flow amount control valve for controlling the flow amount of liquid Lq1 to be supplied, and the like. The first liquid supply unit 68 operates under the control of main controller 50, and supplies liquid Lq1 on wafer W when a liquid immersion area AR (refer to FIG. 2) is formed on wafer W. Incidentally, the tank, the temperature adjustment unit, the filtering unit, and the compression pump do not all have to be arranged in the first liquid supply unit 68 of exposure apparatus 100, and at least a part of such parts can be substituted by the equipment available in the factory where exposure apparatus 100 is installed.

The first liquid recovery unit 69 connects to nozzle member 70 via a recovery pipe 67. This first liquid recovery unit 69 recovers liquid Lq1 supplied to the first space K1. The first liquid recovery unit 69 includes a vacuum system (suction unit) such as, for example, a vacuum pump, a gas-liquid separator for separation of liquid and gas in liquid Lq1 that has been recovered, a tank for holding liquid Lq1 that has been recovered, a flow amount control valve for controlling the flow amount of liquid Lq1 to be recovered, and the like. Incidentally, exposure apparatus 100 does not have to be equipped with all of the vacuum system, the gas-liquid separator, the tank, and the flow amount control valve, and these parts can be partially substituted by the equipment available in the factory where exposure apparatus 100 is placed. The first liquid recovery unit 69 operates under the control of main controller 50, and recovers liquid Lq1 on wafer W supplied from the first liquid supply unit 68 so as to form liquid immersion area AR on wafer W by a predetermined amount.

The second liquid supply unit 72 connects to a side surface of barrel 140 on the +Y side at a position slightly above nozzle member 70, via supply pipe 74. The second liquid supply unit 72 supplies liquid Lq2 to a second space K2 (refer to FIG. 2)

formed on the upper surface side of end optical element 191 of projection optical system PL. The second liquid supply unit 72 is equipped with a tank for holding liquid Lq2, a temperature adjustment unit for adjusting the temperature of liquid Lq2 that is to be supplied, a filtering unit for removing a foreign material in liquid Lq2, a compression pump and the like. Incidentally, the tank, the temperature adjustment unit, the filtering unit, and the compression pump do not all have to be arranged in the second liquid supply unit 72 of exposure apparatus 100, and at least a part of such parts can be substituted by the equipment available in the factory where exposure apparatus 100 is installed.

The second liquid recovery unit 73 connects to a side surface of barrel 140 on the −Y side at a position slightly above nozzle member 70, via recovery pipe 75. This the second liquid recovery unit 73 recovers liquid Lq2 supplied to the second space K2 described above. The second liquid recovery unit is equipped with includes a vacuum system (suction unit) such as, for example, a vacuum pump, a gas-liquid separator for separation of liquid and gas in liquid Lq2 that has been recovered, a tank for holding liquid Lq2 that has been recovered, and the like. Incidentally, exposure apparatus 100 does not have to be equipped with all of the vacuum system, the gas-liquid separator, and the tank and these parts can be partially substituted by the equipment available in the factory where exposure apparatus 100 is installed.

Figure 2:
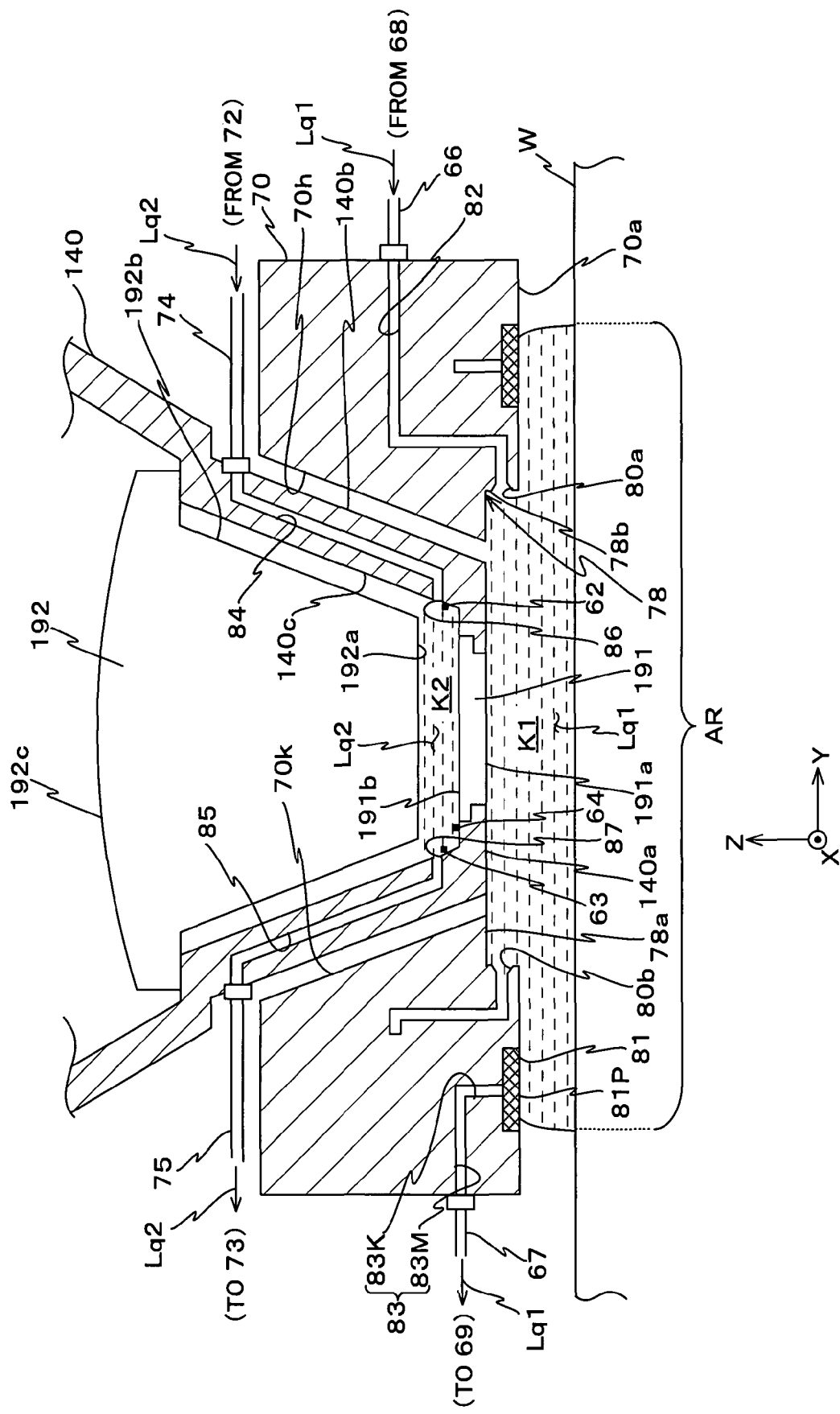
FIG. 2 is a sectional view that shows an image plane side of a projection optical system and the vicinity of a nozzle member.

FIG. 2 shows a sectional view of the image plane side of projection optical system PL and the vicinity of nozzle member 70, whereas FIG. 3 shows a view of nozzle member 70 when viewed from below. The configuration and the like of nozzle member 70 and its vicinity will now be explained, according to FIGS. 2 and 3.

In FIGS. 2 and 3, end optical element 191 and border lens 192, which is placed above end optical element 191, are supported by barrel 140. End optical element 191 is plane-parallel plate and, the lower surface of end optical element 191, lower surface 191*a*, is arranged substantially flush with the lower surface of barrel 140, lower surface 140*a*. The upper surface of end optical element 191, upper surface 191*b*, supported by barrel 140 and lower surface 191*a* are substantially parallel with the XY plane. Further, end optical element (plane-parallel plate) 191 is supported in a substantially horizontal manner, and has no refractive power. Further, the gap between barrel 140 and end optical element 191 is sealed. More specifically, the first space K1 on the lower side of end optical element 191 and the second space K2 on the upper side of end optical element 191 are both independent spaces, and the liquid flow is blocked between the first space K1 and the second space K2. As is described above, the first space K1 is the space between end optical element 191 and wafer W (or wafer stage WST), and liquid Lq1 in the first space K1 forms liquid immersion area AR. Meanwhile, the second space K2 is a part of the inner space of barrel 140, and is the space between the upper surface 191*b* of end optical element 191 and a lower surface 192*a* of boarder lens 192 arranged above the upper surface 191*b* of end optical element 191.

Incidentally, in FIG. 2 the area of upper surface 191*b* of end optical element 191 is substantially the same as an area of lower surface 192*a* of border lens 192 opposing the upper surface 191*b*, or smaller than the area of lower surface 192*a*, and in the case the second space K2 is filled with liquid Lq2, liquid Lq2 covers almost the entire surface of upper surface 191*b* of end optical element 191. However, the area of upper surface 191*b* of end optical element 191 can be larger than the area of lower surface 192*a* of border lens 192. In this case, liquid Lq2 can cover only a part of upper surface 191*b* of end optical element 191.

Further, end optical element 191, can be easily attached to or detached from barrel 140. That is, an arrangement where end optical element 191 is exchangeable is employed.

Nozzle member 70 is placed as is shown in FIG. 2 so as to surround the lower end section of barrel 140 above wafer W (wafer stage WST). Nozzle member 70 has a hole section 70*h* in which the lower end of projection unit UP (barrel 140) can be placed in the center via a predetermined gap.

In the embodiment, the projection area of projection optical system PL, more specifically, effective exposure area IA is set in a rectangular shape whose longitudinal direction is in the X-axis direction (non-scanning direction), as is shown in FIG. 3.

On a lower surface 70*a* of nozzle member 70 opposed to wafer W, a recessed section 78 whose longitudinal direction is in the X-axis direction is formed in the center. In the center of an inner bottom surface 78*a* of recessed section 78, the opening end of hole section 70*h* described earlier is formed. Inner bottom surface 78*a* of recessed section 78 is roughly parallel to the XY plane, and serves as a cavity plane opposed to wafer W supported by wafer stage WST. Further, a sidewall inner surface 78*b* of recessed section 78 is arranged substantially orthogonal to the XY plane.

In sidewall inner surface 78*b* of recessed section 78 formed on the lower surface 70*a* of nozzle member 70, first supply openings 80*a* and 80*b* are formed on both sides in the Y-axis direction, respectively, with end optical element 191 (projection area IA) of projection optical system PL in between. The first supply openings 80*a* and 80*b* connect to one end of a first supply passage 82 formed inside of nozzle member 70, respectively. The first supply passage 82 branches off in the middle so that the branched end can connect to a plurality of (two) the first supply openings 80*a* and 80*b*, respectively. Further, the other end of the first supply passage 82 connects to one end of supply pipe 66 referred to earlier.

The liquid supply operation of the first liquid supply unit 68 is controlled by main controller 50. In order to form liquid immersion area AR, main controller 50 delivers liquid Lq1 from the first liquid supply unit 68. Liquid Lq1 sent out from the first liquid supply unit 68 flows into an end section of the first supply passage 82 formed inside nozzle member 70, after flowing through supply pipe 66. Then, liquid Lq1 that flows into the end section of the first supply passage 82 is supplied to the first space K1 between end optical element 191 and wafer W from a plurality of (two) supply openings, the first supply openings 80*a* and 80*b* formed in nozzle member 70. Incidentally, in the embodiment, liquid Lq1 supplied from the first supply openings 80*a* and 80*b* comes out substantially parallel to the surface of wafer W, however, the first supply opening can be formed so that liquid Lq1 is supplied in a downward direction.

Further, the first supply opening can be arranged on both sides of end optical element 191 in the X-axis direction, or the first supply opening may be arranged in one spot.

In lower surface 70*a* of nozzle member 70, on the outer side of recessed section 78 with projection area IA of projection optical system PL serving as a reference, a first recovery opening 81 is arranged. The first recovery opening 81 is arranged in lower surface 70*a* of nozzle member 70 facing wafer W, on the outer side of the first supply openings 80*a* and 80*b* with respect to projection area IA of projection optical system PL, and is formed in a ring shape so that the first recovery opening 81 surrounds projection area IA and the first supply openings 80*a* and 80*b*. Further, in the first recovery opening 81, a porous-body 81P is arranged.

One end of recovery pipe 67 previously described connects to an end section of a manifold flow path 83M constituting a part of a first recovery passage 83 formed inside of nozzle member 70, as is shown in FIG. 2. Meanwhile, the other end section of manifold passage 83M connects to a part of annular passage 83K that constitutes a part of the first recovery passage 83 connecting to the first recovery opening 81.

Main controller 50 controls the liquid recovery operation of the first liquid recovery unit 69. In order to recover liquid Lq1, main controller 50 drives the first liquid recovery unit 69. By driving the first liquid recovery unit 69, liquid Lq1 on wafer W flows through passage 83 via the first recovery opening 81, which is arranged above wafer W. Then, the first liquid recovery unit 69 recovers liquid Lq1 by suction, via recovery pipe 67.

In a sidewall inner surface 140c of barrel 140, a second supply opening 86 is formed. The second supply opening 86 is formed at a position in the vicinity of the second space K2, and is arranged on the +Y side of optical axis AX of projection optical system PL. The second supply opening 86 connects to one end of a second supply passage 84 formed inside the sidewall of barrel 140, and the other end section of the second supply passage 84 connects to one end of supply pipe 74 previously described.

Further, at a position that almost faces the second supply opening 86 in sidewall inner surface 140c of barrel 140, a second recovery opening 87 is formed. The second recovery opening 87 is formed at a position in the vicinity of the second space K2, and is arranged on the −Y side of optical axis AX of projection optical system PL. The second recovery opening 87 connects to one end of a second recovery passage 85 formed inside the sidewall of barrel 140, and the other end section of the second recovery passage 85 connects to one end of recovery pipe 75 previously described.

Main controller 50 controls the liquid supply operation of the second liquid supply unit 72. When main controller 50 delivers Lq2 liquid from the second liquid supply unit 72, liquid Lq2 sent out flows into an end section of the second supply passage 84 formed inside of barrel 140, after flowing through supply pipe 74. Then, liquid Lq2, which flows into the one end section of the second supply passage 84, is supplied to the second space K2 between optical element 192 and end optical element 191 from the second supply opening 86 formed in sidewall inner surface 140c of barrel 140. In this case, from the second supply opening 86, liquid Lq2 comes out substantially parallel to the upper surface 91b of end optical element 191, more specifically substantially parallel to the XY plane (in a lateral direction).

Main controller 50 controls the liquid recovery operation of the second liquid recovery unit 73. In order to recovery liquid Lq2, main controller 50 drives the second liquid recovery unit 73. By driving the second liquid recovery unit 73, liquid Lq2 in the second space K2 flows into the second recovery passage 85 via the second recovery opening 87, and then is recovered by suction by the second liquid recovery unit 73 via recovery pipe 75.

Incidentally, in the embodiment, passages 84 and 85 are formed inside the sidewall of barrel 140, respectively, however, a through hole can be arranged in a part of barrel 140, and piping that serves as a passage and can be put in the through hole. Further, in the embodiment, supply pipe 74 and recovery pipe 75 are arranged separately from nozzle member 70, however, instead of supply pipe 74 and recovery pipe 75, a supply path and a recovery path can be arranged inside nozzle member 70, connecting to passages 84 and 85 formed inside barrel 140, respectively.

Incidentally, the structure and arrangement of the liquid immersion mechanism (nozzle member 70, liquid supply units 68 and 72, liquid recovery units 69 and 73) are not limited to the ones described above, and the liquid immersion mechanism of various forms can be applied, as long as the predetermined space in the optical path of the illumination light IL can be filled with liquid.

Liquid Lq2 filled in the second space K2 comes into contact with lower surface 192a of border lens 192 and upper surface 191b of end optical element 191, whereas liquid Lq1 of the first space K1 comes into contact with lower surface 191a of end optical element 191. In the embodiment, at least optical elements 191 and 192 are made of quartz. And since quartz has a high affinity with liquids Lq1 and Lq2, namely the purified water, liquids Lq1 and Lq2 can be made to come into close contact with substantially the entire surface of lower surface 192a of border lens 192, upper surface 191b of end optical element 191 and lower surface 191a, each serving as a liquid contact surface. Accordingly, by making liquids Lq2 and Lq1 come into close contact with 192a, 191b and 191a which are the liquid contact surfaces of optical elements 192 and 191, the optical path between optical element 192 and end optical element 191 and the optical path between end optical element 191 and wafer W can be filled with liquids Lq2 and Lq1 without fail.

Incidentally, at least one of optical elements 192 and 191 can be fluorite that has a high affinity for water. Further, for example, the remaining optical elements can be made of fluorite, while optical elements 192 and 191 are made of quartz, or the optical elements can all be made of quartz (or fluorite).

Further, on liquid contact surfaces 192a, 191b, and 191a of optical elements 192 and 191, a hydrophilic (lyophilic) treatment can be applied, so as to increase the affinity for liquids Lq2 and Lq1.

Further, in the embodiment, sidewall inner surface 140c of barrel 140 and side 192b of border lens 192 each have liquid repellency due to liquid repellent treatment. Making each of sidewall inner surface 140c of barrel 140 and side 192b of border lens 192 liquid repellent prevents liquid Lq2 in the second space K2 from entering the gap that is formed between sidewall inner surface 140c and side 192b.

As the liquid repellent treatment, for example, treatment of coating a liquid repellent material such as fluorinated resin material as in polytetrafluoroethylene, acrylic resin material, silicon resin material, or the like, or applying a thin film made of such liquid repellent material can be given.

Further, liquid repellent treatment may be applied to both a sidewall outer surface 140b of barrel 140 and a sidewall inner surface 70k of hole section 70h of nozzle member 70. By making sidewall outer surface 140b and sidewall inner surface 70k liquid repellent, liquid Lq1 in the first space K1 can be kept from entering the gap formed between sidewall outer surface 140b and sidewall inner surface 70k.

In exposure apparatus 100 of the embodiment, a first temperature sensor 62 and a second temperature sensor 63 (refer to FIGS. 2 and 5) that each detect the temperature of liquid Lq2 are arranged in the vicinity of the end section on the +Y side and in the vicinity of the end section on the −Y side of the second space K2, respectively. The detection value of temperature sensors 62 and 63 are supplied to main controller 50.

Further, in exposure apparatus 100, an oximeter 64 (refer to FIGS. 2 and 5) for detecting dissolved oxygen concentration of liquid Lq2 inside the second space K2 are installed, and the detection values of oxygen concentration sensor 64 are supplied to main controller 50.

Incidentally, a temperature sensor for detecting the temperature of liquid Lq1 in the first space K1 and/or an oxygen concentration sensor for detecting dissolved oxygen concentration of liquid Lq1 can be arranged, however, in the embodiment, such sensors are not arranged.

In exposure apparatus 100 of the embodiment, although it is not shown in FIG. 1, a multiple point focal point position detection system by an oblique incidence method that includes an irradiation system 110a and a photodetection system 110b (refer to FIG. 5) and is similar to the one disclosed in, for example, Kokai (Japanese Patent Unexamined Application Publication) No. 6-283403 bulletin and the corresponding U.S. Pat. No. 5,448,332 or the like, is arranged. As long as the national laws in designated states (or elected states), to which this international application is applied, permit, the above disclosures of the publication and the U.S. patent are incorporated herein by reference. Incidentally, the multiple point focal point position detection system can perform detection of the positional information of the wafer W surface during exposure of wafer W in order to perform position adjustment on the wafer W surface, or the multiple point focal point position detection system can perform detection of the positional information of the wafer W surface before wafer W begins to be exposed, and position adjustment on the wafer W surface can be performed without using the multiple point focal point position detection system during the exposure of wafer W. In this case, the multiple point focal point position detection system can perform detection on the positional information of the wafer W surface in a state where wafer W is not placed right under projection unit PU.

The control system includes main controller 50 in FIG. 1, and main controller 50 is composed including a so-called microcomputer (or, minicomputer) consisting of a CPU (Central Processing Unit), ROM (Read Only Memory), RAM (Random Access Memory), and the like, and has overall control over the entire apparatus. Main controller 50 connects to memory 51.

Next, an estimation calculation of the irradiation change of the image-forming characteristic of projection optical system PL (including the second liquid Lq2) and the optical system (hereinafter refer to appropriately as "optical system PLL" (refer to FIG. 4)) including the first liquid Lq1, caused by the absorption of illumination light IL of projection optical system PL (including the second liquid Lq2) will be described.

<Measurement of Irradiation Amount>

First of all, a measuring method of irradiation amount P of illumination light IL, which will be a premise, will be described.

Reticle R used for exposure is put on reticle stage RST, and an illumination condition appropriate for exposure using reticle R is set. The illumination condition is set, for example, by main controller 50 selecting an aperture stop of illumination system aperture stop plate 24 arranged in the vicinity of the emitting end of fly-eye lens 22, according to reticle R.

Next, main controller 50 drives wafer stage WST so that irradiance monitor 58 comes right under projection optical system PL. When wafer stage WST is driven, the first space K1 previously described is filled with liquid Lq1 by operating the first liquid supply unit 68 and the first liquid recovery unit 69, and liquid Lq1 is also constantly replaced.

Further, the second space K2 in projection unit PU is filled with liquid Lq2.

Next, main controller 50 starts the emission of light source 16, and by taking in an output $P_0$ of irradiance monitor 58 and output $I_0$ of integrator sensor 46 at a predetermined sampling interval $\Delta t$ simultaneously while moving reticle stage RST under the same condition as in the actual exposure, main controller 50 stores output $P_0$ (irradiation amount $P_0$) of irradiance monitor 58 depending on the movement position (scanning position) of reticle stage RST and output $I_0$ of integrator sensor 46 corresponding to output $P_0$ in an internal memory.

More specifically, irradiation amount $P_0$ and integrator sensor output $I_0$ are stored in the internal memory as functions that correspond to the scanning position of reticle R.

Main controller 50 performs such preparatory operations prior to exposure. And, at the time of the actual exposure, based on irradiation amount $P_0$ and output $I_0$ of integrator sensor 46, which were stored according to the scanning position of reticle R and output $I_1$ of integrator sensor 46 at the time of exposure, irradiation amount (irradiation amount per the unit time) $P_{EXP}$ at that time is calculated based on the next formula (1) and is used for calculating illumination light absorption.

$$P_{EXP}=P_0 \times I_1/I_0 \tag{1}$$

According to formula (1), because the output ratio of integrator sensor 46 is used for calculation, the irradiation amount can be calculated without an error even in the case the power of light source 16 fluctuates. Further, because the formula is a function according to the scanning position of reticle R, the irradiation amount can be precisely calculated, for example, even when the reticle pattern is arranged partially within a plane.

Incidentally, in the description above, the output of irradiance monitor 58 was to be taken in under the illumination condition on actual exposure as a preparatory operation, however, For example, when a signal is saturated due to a characteristic of irradiance monitor 58, the preparatory operation can be performed under an illumination condition in which the illumination light quantity is deliberately attenuated, such as by selectively putting in an ND filter of rough energy adjuster 20 on the path of the illumination light. In this case, irradiation amount $P_{EXP}$ at the time of the real exposure should be calculated in consideration of the attenuation ratio of the ND filter.

<Measurement of Wafer Reflectivity>

Next, a measurement method of wafer reflectivity $R_W$ which also becomes a premise is described. On wafer stage WST, two reflecting plates (not shown) are installed that have a known reflectivity $R_H$ and reflectivity $R_L$, respectively. First of all, as in the irradiation light quantity measurement described above, main controller 50 sets exposure conditions (reticle R, a reticle blind, illumination condition) which are the same as in an actual exposure, and drives wafer stage WST so that the reflecting plate having the reflectivity $R_H$ is moved right under projection optical system PL. At this point, the first space K1 previously described is filled with liquid Lq1, and liquid Lq1 is also constantly replaced. Further, the second space K2 in projection unit PU is filled with liquid Lq2.

Next, main controller 50 starts the emission of light source 16, and by taking in an output $VH_0$ of reflection amount monitor 47 and output $IH_0$ of integrator sensor 46 at a predetermined sampling interval simultaneously while moving reticle stage RST under the same condition as in the actual exposure, main controller 50 stores output $VH_0$ of reflection amount monitor 47 depending on the movement position (scanning position) of reticle stage RST and output $IH_0$ of integrator sensor 46 corresponding to output $P_0$ in the internal memory. Accordingly, output $VH_0$ of reflection amount monitor 47 and output $IH_0$ of integrator sensor 46 are stored in the internal memory as a function corresponding to the scanning position of reticle R. Next, main controller 50 drives wafer stage WST so as move reflecting plate of reflectivity $R_L$ right under projection optical system PL, and in a manner similar to the description above, stores output $VL_0$ of reflection amount monitor 47 and output $IL_0$ of integrator sensor 46 in the internal memory as a function corresponding to the scanning position of reticle R.

Main controller 50 performs such preparatory operations prior to exposure. And at the time of the actual exposure, based on the output of reflection amount monitor 47 and the output of integrator sensor 46 which corresponds to the scanning position of reticle R and an output $V_1$ of reflection amount monitor 47 and output $I_1$ of integrator sensor 46 at the time of exposure, wafer reflectivity $R_{EXPW}$ is calculated based on the following formula (2), which is used for calculating illumination light absorption.

$$R_{EXPW} = \frac{R_H - R_L}{\tilde{V}_H - \tilde{V}_L} \times V_1 + \frac{\tilde{V}_H \times R_L - \tilde{V}_L \times R_H}{\tilde{V}_H - \tilde{V}_L} \quad (2)$$

here $$\tilde{V}_H = V_{H0} \times \frac{I_1}{I_{H0}}$$

$$\tilde{V}_L = V_{L0} \times \frac{I_1}{I_{L0}}$$

According to formula (2), because output ratio of integrator sensor 46 is used for the calculation, wafer reflectivity can be precisely calculated even in the case when the power of light source 16 fluctuates.

Incidentally, measurement of the basic data that it is required to perform irradiation amount calculation and reflectivity calculation referred to above can be performed for every illumination condition with respect to the pattern on the reticle, and the measurement results can be stored beforehand in memory 51 by every illumination condition.

<Calculation of Amount of Change of Image-Forming Characteristic by Illumination Light Absorption>

Next, a calculation method of variation in the image-forming characteristic of optical system PLL due to the illumination light absorption of projection optical system PL (including liquid Lq2 in the second space K2) will be described, picking variation of focus as an example.

From irradiation amount $P_{EXP}$ and wafer reflectivity $R_{EXPW}$ obtained in the manner described above, focus variation $F_{HEAT}$ of optical system PLL due to the illumination light absorption of projection optical system PL (including liquid Lq2 in the second space K2) is calculated using a model function expressed as in the following formula (3).

$$F_{HEAT}(t) = F_{EXP}(t) + F_W(t) \quad (3)$$

In this case, $F_{HEAT}(t)$ is focus variation due to the irradiation of optical system PLL at time t, more specifically, irradiation variation [m] of the focus. Further, $F_{EXP}(t)$ is focus variation [m] of optical system PLL due to the illumination light absorption of projection optical system PL excluding liquid Lq2 in the second space K2 at time t. Further, FW (t) is focus variation [m] of optical system PLL due to the illumination light absorption of liquid Lq in the second space K2 at time t. In this case, the reason why function terms of the focus variation of optical system PLL due to the illumination light absorption of liquid Lq1 in the first space K1 are not included in formula (3) above is because since liquid Lq1 in the first space is constantly replaced, the variation amount of the image-forming characteristic of the optical system due to the illumination light absorption of liquid Lq1 is extremely small and is at a level which can be ignored.

Further, $F_{EXP}(t)$ and $F_W(t)$ in formula (3) above are functions that can be expressed as in formula (4) and formula (5) below.

$$F_{EXP}(t) = \sum_{k=A,B,C} \left[ F_{EXPk}(t - \Delta t) \times \exp\left(-\frac{\Delta t}{T_{FEXPk}}\right) + \right. \quad (4)$$

$$\left. C_{FEXPk} \times (1 + \alpha_{FEXP} \times R_{EXPW}) \times P_{EXP} \times \left\{1 - \exp\left(-\frac{\Delta t}{T_{FXPk}}\right)\right\} \right]$$

In this case, $\Delta t$ is a calculation interval of variation in the image-forming characteristic of the optical system due to the illumination light absorption, that is, the sampling interval previously described, and $T_{FEXPk}$ is a time constant [sec] (k=A, B, C) of the focus variation (hereinafter referred to as "irradiation variation of the focus of the optical system due to the illumination light absorption of projection optical system PL") of optical system PLL due to the illumination light absorption of projection optical system PL except for liquid Lq in the second space K2.

Further, $F_{EXPk}(t-\Delta t)$ is a time constant $T_{FEXPk}$ component [m] (k=A, B, C) of the irradiation variation of the focus of the optical system due to the illumination light absorption of projection optical system PL except for liquid Lq in the second space K2 at time (t–Δt), $C_{FEXPk}$ is a saturation value [m/W] (k=A, B, C) of the irradiation variation of the focus of the optical system due to the illumination light absorption of projection optical system PL except for liquid Lq in the second space K2, and $\alpha_{FEXP}$ is a wafer reflectivity dependence of the irradiation variation of the focus of the optical system due to the illumination light absorption of projection optical system PL except for liquid Lq in the second space K2. Incidentally, A, B, C=X, Y, Z.

$$F_W(t) = \sum_{k=A,B,C} \left[ F_{Wk}(t - \Delta t) \times \exp\left(-\frac{\Delta t}{T_{Fwk}}\right) + \right. \quad (5)$$

$$\left. C_{FWk} \times (1 + \alpha_{FW} \times R_{WW}) \times P_{EXP} \times \left\{1 - \exp\left(-\frac{\Delta t}{T_{Wk}}\right)\right\} \right]$$

In this case, Δt is the sampling interval previously described (the calculation interval of variation in the image-forming characteristic of optical system PPL due to the illumination light absorption), and $T_{FWk}$ is a time constant [sec] (k=A, B, C) of the focus variation (hereinafter referred to as "irradiation variation of the focus of optical system PLL due to the illumination light absorption of liquid Lq2") of optical system PLL due to the illumination light absorption of liquid Lq2 in the second space K2. Further, $F_{Wk}(t-\Delta t)$ is a time constant $T_{FWk}$ component [m] (k=A, B, C) of the irradiation variation of the focus of optical system PLL due to the illumination light absorption of liquid Lq2 at time (t–Δt), and $C_{FWk}$ is a saturation value [m/W] (k=A, B, C) of the irradiation variation of the focus of optical system PLL due to the illumination light absorption of liquid Lq2. Further, $R_{WW}$ is wafer reflectivity, and wafer reflectivity $R_{EXPW}$ mentioned earlier is to be used. Further, $\alpha_{FW}$ is wafer reflectivity dependence of the irradiation variation of the focus of optical system PLL due to the illumination light absorption of liquid Lq2.

When input irradiation amount $P_{EXP}$ is viewed as an input and focus variation is viewed as an output, the model functions in formulas (4) and (5) above both take the form of a sum of three primary delay systems. Incidentally, the model functions can be changed, depending on the illumination light absorption amount of projection optical system PL and of liquid Lq2, and the required precision. For example, if the illumination light absorption amount is relatively small, the model function can be a sum of two primary delay systems, or one primary delay system. Further, if it takes time for the image-forming characteristic change to appear because of heat conduction after projection optical system PL and liquid Lq2 absorb the illumination light, a model function of a dead time system may be employed. Incidentally, the time constant of the irradiation variation of the focus, the saturation value of the irradiation variation of the focus, and the wafer reflectivity dependence are all obtained by experiment. Or, such values can be obtained by calculation, by a highly precise thermal analysis simulation. Or, such values can be obtained both ways.

By a method similar to the description above regarding focus, variation due to the illumination light absorption can be calculated also for other image-forming characteristics, more specifically curvature of image plane, magnification, distortion, comatic aberration, and spherical aberration. More specifically, curvature of image plane change $CU_{HEAT}$ due to the illumination light absorption, magnification change $M_{HEAT}$ due to the illumination light absorption, distortion change $D_{HEAT}$ due to the illumination light absorption, comatic aberration change $CO_{HEAT}$ due to the illumination light absorption and spherical aberration change $SA_{HEAT}$ due to the illumination light absorption can be calculated, based on a model function similar to the one in formula (3) (and formulas (4) and (5)).

Incidentally, in the focus described above, a model function of the sum of three primary delay systems was necessary, however, because one primary delay system may be sufficient enough for calculating, for example, the curvature of image plane, the model function of the illumination light absorption can be changed for each image-forming characteristic depending on the precision that is required. In the case of using a model function of two or one primary delay system, there is an effect of reducing the computation time.

In the embodiment, the model function of formulas (3), (4), (5) and the like described above is set by main controller 50 for every illumination condition, using measurement results of the basic data necessary for irradiation amount calculation for each illumination condition described above and reflectivity calculation stored in memory 51.

Next, a correction method of six types of rotation symmetry image-forming characteristics of projection optical system PL, more specifically, focus, curvature of image plane, magnification, distortion, coma, and spherical aberration, are described.

First of all, the amount of change of the six types of image-forming characteristics, focus, curvature of image plane, magnification, distortion, coma, and spherical aberration expressed in a first matrix (to be expressed as A) having six rows and one column whose elements are the amount of change above, can be expressed as a product of a second matrix (to be expressed as B) having six rows and five columns whose elements are the variation coefficients of the six types of the image-forming characteristics in each movable lens and a third matrix (to be expressed as C) having five rows and one column whose elements are the movement amount of the five movable lenses. That is, formula (6) below becomes valid.

$$A=B*C \quad (6)$$

Then, first of all, at the stage of initial adjustment, main controller 50 measures the six types of image-forming characteristics, which are focus, curvature of image plane, magnification, distortion, coma, and spherical aberration, while driving each of the five movable lenses described earlier through image-forming characteristic correction controller 52, and obtains the six types of the image-forming characteristic variation coefficients (to be expressed as $C_{11}$ to $C_{65}$) in each movable lens which are the elements of the second matrix described above. Incidentally, the image-forming characteristic variation coefficients $C_{11}$ to $C_{65}$ can be obtained by calculation, by a highly precise optical simulation.

And then, by using the five types of image-forming characteristic variation coefficients $C_{21}$ to $C_{65}$ excluding focus among the image-forming characteristic variation coefficients above and the movement amount (a drive quantity) of the five movable lenses, the following linear simultaneous formula with five unknowns in which matrix C having five rows and one column whose elements are the movement amount (drive quantity) of each movable lens is expressed as a product of an inverse matrix of a matrix (to be expressed as B') having five rows and five columns whose elements are the five types of image-forming characteristic variation coefficients $C_{21}$ to $C_{65}$ excluding focus and a matrix (to be expressed as A') having five rows and one column whose elements are the variation amount of the five types of the image-forming characteristics, which are curvature of image plane, magnification, distortion, coma, and spherical aberration, can be set up.

$$C=[B']^{-1}*A' \quad (7)$$

The linear simultaneous formula with five unknowns in formula (7) described above is made in advance, and is stored inside memory 51.

Then, for example, when magnification is to be changed to a predetermined magnification by using the simultaneous formula above, a specified quantity is to be put into the image-forming characteristic variation coefficients of magnification in the formula, and a new simultaneous formula in which "zero" is put into the other four types of image-forming characteristic variation coefficients is to be set, and then the simultaneous formula is to be solved so as to obtain the drive quantity of each movable lens, and by driving each movable lens according to the drive quantity, it becomes possible to control only the magnification to a predetermined value without affecting curvature of image plane, distortion, coma, and spherical aberration. In the case, the case has been described where magnification has been changed, however, the above description is also the same for curvature of image plane, distortion, coma, and spherical aberration, and these values can be changed individually without affecting other image-forming characteristics.

The reason for excluding focus in the simultaneous formula above is because when a movable lens is driven to correct other image-forming characteristics such as magnification, the focus fluctuates along with the drive and it becomes necessary to consider this influence when correcting the focus.

To correct the five types of image-forming characteristics described above, when a focus change that occurs as a side effect by having moved a group of five lenses is expressed as FG, FG can be obtained as a product of a matrix having one row and five columns whose elements are the variation coefficients $C_{11}$ to $C_{15}$ Of focus and a matrix of five rows and one column whose elements are the drive quantity of each movable lens obtained above.

Focus change FL of the optical system itself turns out to be formula (8) below, along with an illumination light absorption change and lens movement change.

$$FL = F_{HEAT} + FG \tag{8}$$

By substituting FL in a predetermined focus correction formula according to the drive of wafer stage WST and driving wafer stage WST in the Z-axis direction so that focus error becomes the zero, a conjugate relationship (optical distance) between reticle R and wafer W is maintained.

Next, operations on exposure in exposure apparatus 100 of the present embodiment will be described.

On performing exposure of wafer W, main controller 50 controls the second liquid supply unit 72 and supplies liquid Lq2 to the second space K2. At this point, main controller 50 supplies liquid Lq2 by the second liquid supply unit 72 and recovers liquid Lq2 by the second liquid recovery unit 73 while optimally controlling a supply amount of liquid Lq2 per unit time limit by the second liquid supply unit 72 and a recovery amount of liquid Lq2 per unit time by the second liquid recovery unit 73, and of the second space K2, fills in at least an optical path of illumination light IL with liquid Lq2.

Further, after wafer W is loaded on wafer stage WST at a loading position (wafer exchange position), main controller 50 moves wafer stage WST that holds wafer W to a position under projection optical system PL, that is, to an exposure position. And in a state where wafer stage WST opposes end optical element 191 of projection optical system PL, main controller 50 supplies liquid Lq1 by first liquid supply unit 68 and recovers liquid Lq1 by first liquid recovery unit 69 while optimally controlling a supply amount of liquid Lq1 per unit time by first liquid supply unit 68 and a recovery amount of liquid Lq1 per unit time by the first liquid recovery unit 69, and of the first space K1, forms a liquid immersion area AR of liquid Lq1 on at least an optical path of illumination light IL and fills in the optical path of illumination light IL with liquid Lq1.

Before exposure treatment of wafer W is performed, main controller 50 performs mark measurement of a reference member arranged on wafer stage WST, and various measurement operations (including at least a preliminary preparation for measuring the irradiation amount and a preliminary preparation for measuring the wafer reflectivity previously described), using uneven illuminance measuring sensor 21P, irradiance monitor 58 and the like, and based on the measurement results, performs alignment of wafer W and calibration treatment such as the image-forming characteristic adjustment of projection optical system PL. For example, when a measurement operation using uneven illuminance measuring sensor 21P, irradiance monitor 58 and the like is performed, main controller 50 relatively moves wafer stage WST with respect to liquid immersion area AR of liquid Lq1 by moving wafer stage WST in the XY direction, forms liquid immersion area AR of liquid Lq1 on the photodetection surface of the sensors, and performs measurement operations via liquid Lq1 and liquid Lq2 in the state.

After having performed the alignment and calibration, in parallel with supplying liquid Lq1 on wafer W by first liquid supply unit 68, main controller 50 recovers liquid Lq1 on wafer W by first liquid recovery unit 69 while moving wafer stage WST that supports wafer W in the Y-axis direction (scanning direction), and projects a pattern image of reticle R on wafer W to which a resist has been applied on its surface via projection optical system PL (including liquid Lq2) and liquid Lq1 (that is, liquid of liquid immersion area AR) of the first space K1. In this case, the liquid supply operation by the second liquid supply unit 72 and the liquid recovery operation by the second liquid recovery unit 73 are stopped by main controller 50 at the point when exposure is to begin at the latest, and among the second space K2, at least an optical path of illumination light IL is to be in a state filled with liquid Lq2.

Exposure apparatus 100 of the embodiment projects the image of the pattern of reticle R on wafer W while moving reticle R and wafer W in the Y-axis direction (scanning direction), and during scanning exposure, a part of the pattern image of reticle R is projected within projection area IA via projection optical system PL (including liquid Lq2) and liquid Lq1 in the first space, and in synchronization with reticle R moving in the −Y-direction (or the +Y direction) at a speed V, wafer W moves in the +Y direction (or the −Y-direction) at a speed $\beta*V$ ($\beta$ is projection magnification) with respect to projection area IA. A plurality of shot areas is set on wafer W, and after one shot area has been exposed, the next shot area is moved to a scanning starting position by a stepping movement of wafer W, and hereinafter, scanning exposure of each shot area is performed sequentially while moving wafer W by the step-and-scan method.

In the embodiment, main controller 50 executes estimation calculation (formula (3) and an equivalent calculation) every time $\Delta t$ of the irradiation variation of the image-forming characteristics (various aberrations (including focus)) of optical system PLL due to the illumination light absorption of projection optical system PL (including liquid Lq2) previously described, and controls the exposure operation based on a result of the estimation calculation of the image-forming characteristics.

For example, main controller 50 performs calculation of formula (3), at for example, every time $\Delta t$, and also performs an estimation calculation equivalent to formula (3) every time $\Delta t$, and estimation calculation of the irradiation variation besides focus, which are curvature of image plane, magnification, distortion, coma, and spherical aberration, and using the results of the estimation calculation and the simultaneous formula described earlier, the drive quantity of each movable lens for correcting the change in the image-forming characteristics is to be obtained as is previously described, and by driving each movable lens according to the drive quantity, the irradiation variation of the image-forming characteristic of at least one of curvature of image plane, magnification, distortion, coma, and spherical aberration of the optical system is sequentially corrected.

Further, each time the irradiation variation of the image-forming characteristics excluding focus is corrected via image-forming characteristic correction controller 52, main controller 50 calculates focus change FL of the optical system itself using formula (6) previously described and by substituting FL into a predetermined focus correction formula (in this correction formula, defocus amount measured by a multiple point focal point position detection system (110a and 110b) is included as a term), executes auto focus control of wafer W in which wafer stage WST is driven in the Z-axis direction to make a focus error become zero.

Now, in an immersion exposure apparatus such as exposure apparatus 100 of the embodiment, the purity of the liquid (purified water) may deteriorate when the liquid is continuously used, and bacteria may possibly be generated.

Therefore, in the embodiment, in order to prevent such a situation as much as possible, liquid Lq2 in the second space K2 is exchanged regularly. However, because the exchange of liquid Lq2 becomes a cause of lowering the throughput, the exchange cannot be performed frequently. Thus, in the embodiment, main controller 50 exchanges liquid Lq2 in the second space K2 just before starting the exposure of the first wafer in each lot (or when exposure of a predetermined number of wafers has been completed) using the second liquid supply unit 72 and the second liquid recovery unit 73.

And each time main controller 50 replaces liquid Lq2, main controller 50 executes the calculation of formula (3) previously described immediately after the replacement, with FWk (t−Δt)=0 in formula (5) above. In this case, since exposure is not being performed, irradiation amount $P_{EXP}=0$, therefore, $F_W(t)=0$, and as a consequence, $F_{HEAT}(t)=F_{EXP}(t)$ becomes valid immediately after the replacement of liquid Lq2, therefore, formula (3) becomes the same calculation as formula (4).

As is described above, in the embodiment, since the model formula of the irradiation variation of the image-forming characteristics of optical system PLL due to the illumination light absorption of projection optical system PL excluding liquid Lq2 and the model formula of the irradiation variation of the image-forming characteristics of optical system PLL due to the illumination light absorption of liquid Lq2 are prepared separately, when liquid Lq2 is replaced, it becomes possible to perform an estimation calculation of the irradiation variation of the image-forming characteristics such as focus of the entire optical system PLL including projection optical system PL (including liquid Lq2) and liquid Lq1 precisely, and the image-forming characteristics of the optical system can be adjusted with high precision.

Figure 6A:
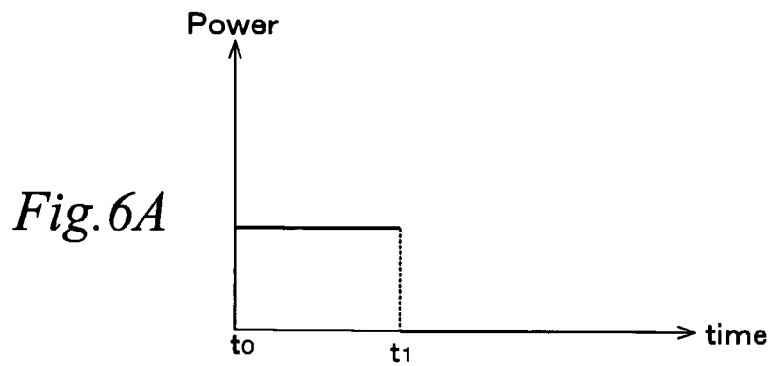
FIGS. 6A to 6D are views used to explain an effect of the exposure apparatus in an embodiment.

For example, the case will be considered when wafer exposure is performed from time $t_0$ time $t_1$, and exposure is ceased from time $t_1$ onward, as is shown in FIG. 6A. In FIG. 6A, the vertical axis is energy intensity Power of the illumination light irradiated on optical system PLL.

Figure 6B:
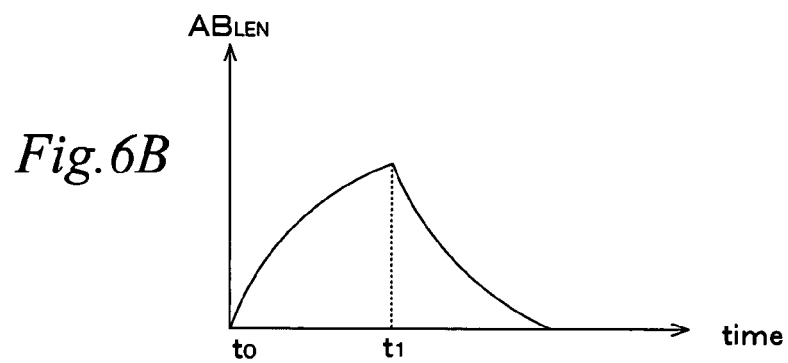
Figure 6C:
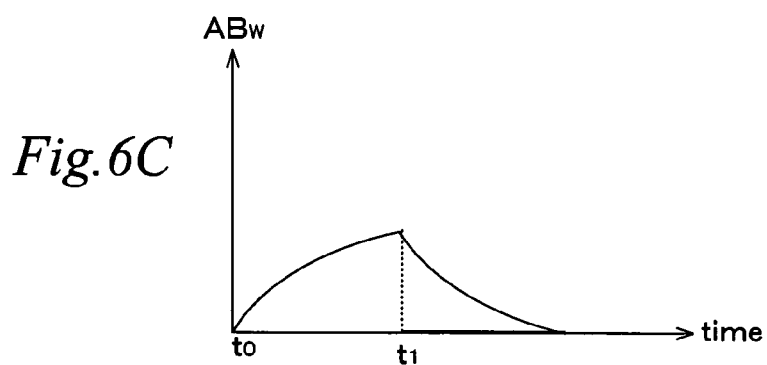

Variation $AB_{LEN}$ of the image-forming characteristics of optical system PLL due to the illumination light absorption of projection optical system PL (excluding liquid Lq2) in this case, is expressed, for example, as in FIG. 6B from the model formula of formula (4) previously described, and variation $AB_W$ of the image-forming characteristics of optical system PLL due to the illumination light absorption of liquid Lq2 turns out to be like the thin solid line in FIG. 6C from the model formula of formula (5) previously described. Further, in the case replacement of liquid Lq2 is performed at time $t_1$, since liquid Lq2 after use on which illumination light IL is irradiated is replaced with liquid Lq2 before use on which illumination light IL has not been irradiated, variation $AB_W$ of the image-forming characteristics of optical system PLL due to the illumination light absorption of liquid Lq2 becomes zero from time t1 onward, as is shown in the thick solid line.

Figure 6D:
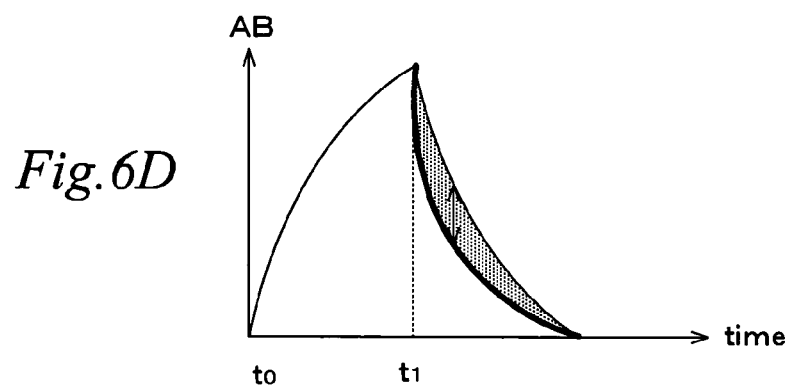

Accordingly, when replacement of liquid Lq2 is performed at time $t_1$, the total irradiation variation AB of optical system PLL which is obtained using the model formula of the irradiation variation of the image-forming characteristics of optical system PLL due to the illumination light absorption of projection optical system PL excluding liquid Lq2 and the model formula of the irradiation variation of the image-forming characteristics of optical system PLL due to the illumination light absorption of liquid Lq2 results to be like the thick solid line in FIG. 6D. Meanwhile, in the case when only the model formula of the variation of the image-forming characteristics of optical system PLL due to the total (including liquid Lq2) illumination light absorption of projection optical system PL is prepared, when liquid Lq2 is replaced it cannot be considered, therefore, even if liquid Lq2 has been replaced at time t1, it becomes similar with the case where replacement is not performed, like the thin solid line in FIG. 6D. Accordingly, an error corresponding to the difference between the thin solid line and the thick solid line will occur in the results of the estimation calculation of the irradiation variation of the image-forming characteristics.

As it has been described above, according to the embodiment, since the model formula of the irradiation variation of the image-forming characteristics of optical system PLL due to the illumination light absorption of projection optical system PL excluding liquid Lq2 and the model formula of the irradiation variation of the image-forming characteristics of optical system PLL due to the illumination light absorption of liquid Lq2 are prepared separately, the error described above does not occur in the result of the estimation calculation of the irradiation variation of the image-forming characteristics of optical system PLL even when replacement of liquid Lq2 is executed. Accordingly, a highly precise estimation calculation of the irradiation variation of the image-forming characteristics of optical system PLL and a highly precise adjustment of the image-forming characteristics of optical system PLL becomes possible, based on this assumption calculation.

Incidentally, as is described above, in the embodiment, since liquid Lq2 in the first space K1 is replaced constantly to lower the influence such as from the mixture of the resist into the liquid, the variation of the image-forming characteristics of the optical system due to the illumination light absorption of liquid Lq1 does not create a problem.

Further, as is previously described, main controller 50 obtains the variation amount of the transmittance of liquid Lq2 to illumination light IL due to the change of dissolved oxygen concentration in liquid Lq2 based on measurement results of oximeter 64, and based on the variation amount of the transmittance, main controller 50 performs integrated exposure amount control (dose control) with respect to wafer W.

Because liquid Lq2 is in contact with the gas (oxygen), for example, in the gap between border lens 192 and barrel 140, it may cause the oxygen to dissolve in liquid Lq2 while the supply operation of the second liquid supply unit 72 and the recovery operation of the second liquid recovery unit 73 are suspended, and change (decrease) the transmittance of liquid Lq2 to illumination light IL.

In the case the transmittance of liquid Lq2 to the illumination light IL changes (decreases), a difference may occur between the light quantity (pulse intensity) of illumination light IL calculated based on the output of integrator sensor 46 and the light quantity (pulse intensity) of illumination light IL that actually reaches wafer W, which could cause a dose control error to wafer W.

Therefore, main controller 50 stores in advance transmittance data which shows a relation between the amount of change of dissolved oxygen concentration in liquid Lq2 and the amount of change of the transmittance of liquid Lq2 to illumination light IL. Further, main controller 50 acquires dissolved oxygen concentration of liquid Lq2 using oximeter 64 just after the liquid has been replaced and stores the data and constantly monitors the dissolved oxygen concentration of liquid Lq2 using oximeter 64, while the operation of the second liquid supply unit 72 and the second liquid recovery unit 73 is suspended after the replacement of liquid Lq2.

Then, based on the measurement results of oximeter 64 and the stored transmittance data, main controller 50 obtains the variation amount of the transmittance of liquid Lq2, and reflects the variation amount in the dose control of wafer W. More specifically, based on the variation amount of the transmittance of liquid Lq2, at least one of the light quantity (pulse intensity) of illumination light IL, the scanning speed of wafer W, the width of the scanning direction (the Y-axis direction) of exposure area IA, and the emission period of the pulsed light of light source 16 is finely adjusted. Accordingly, in the case a transmittance change of liquid Lq2 to illumination light IL occurs, it becomes possible to execute dose control on wafer W with high accuracy.

As is described above, according to exposure apparatus 100 of the embodiment, main controller 50 predicts the variation of the image-forming characteristics, which is a kind of optical properties of the projection optical system including liquid Lq2, due to the energy absorption of liquid Lq2 in the second space K2 in projection unit PU and optical system PLL including liquid Lq1 in the first space K1 based on irradiation amount (energy information) obtained using integrator sensor 46, and the exposure operation to wafer W is controlled, based on the prediction results.

In this embodiment, main controller 50 uses formula (5) which includes irradiation amount (energy information) as a parameter, and predicts the variation of the image-forming characteristics of optical system PLL due to the energy absorption of liquid Lq2. Further, main controller 50 uses formula (4) including irradiation amount (the energy information) as a parameter separate from formula (5), so as to also predict the variation of the optical properties (image-forming characteristics) of optical system PLL due to the energy absorption of illumination light IL by projection optical system PL (excluding liquid Lq2). Then, based on formula (3), which is the sum of formula (5) and formula (4), main controller 50 obtains by estimation calculation the irradiation variation of the image-forming characteristic of the optical system, and controls the exposure operation based on the calculation results. Accordingly, it becomes possible to predict the variation of optical properties (image-forming characteristics) of optical system PLL, taking into consideration energy absorption of the illumination lights in liquid Lq2 and projection optical system PL (excluding liquid Lq2), respectively.

Further, main controller 50 controls the liquid immersion mechanism previously described and replaces liquid Lq2 on which illumination light IL has been irradiated with liquid Lq2 on which illumination light IL has not been irradiated, and also when liquid Lq2 is replaced by the liquid immersion mechanism, the variation of the optical properties of optical system PLL due to the energy absorption of liquid Lq2 will be regarded as eliminated. That is, $F_{W_{k}}(t-\Delta t)=0$, which leads to $F_{W}(t)=0$ as is previously described.

Accordingly, just after replacement and the like of liquid Lq2, it becomes possible to execute exposure operation without taking into consideration the variation of optical properties of optical system PLL due to the energy absorption of liquid Lq2.

Further, according to exposure apparatus 100 of the embodiment, when wafer W is exposed by main controller 50, the integrated exposure amount to wafer W is controlled based on variation of the transmittance of liquid Lq2 in the second space inside projection optical system PL to illumination light IL emitted from light source 16. In the embodiment, oximeter 64 indirectly monitors the variation of the transmittance, based on the change of dissolved oxygen concentration in liquid Lq2. More specifically, in the embodiment, when main controller 50 exposes wafer W by irradiating illumination light IL from light source 16 on wafer W, it can be said that the integrated exposure amount to wafer W is controlled based on the change of dissolved oxygen concentration in liquid Lq2 measured by oximeter 64. Accordingly, even in the case when the transmittance of liquid Lq2 fluctuates due to a change of the dissolved oxygen concentration of liquid Lq2 and a difference occurs between light quantity (pulse intensity) of illumination light IL calculated based on the output of integrator sensor 46 and the light quantity (pulse intensity) of illumination light IL which actually reaches wafer W, it becomes possible to execute dose control on wafer W with high precision.

Further, in the embodiment, end optical element 191 consisting of a plane-parallel plate is placed under border lens 192 that has a lens function, and by filling liquid Lq1 into the first space K1 under lower surface 191*a* of end optical element 191 and liquid Lq2 into the second space K2 above upper surface 191*c* of end optical element 191, reflection loss on lower surface 192*a* of boarder lens 192 and upper surface 191*b* of end optical element 191 is reduced which allows wafer W to be exposed favorably in a state where a large numerical aperture is secured on the image side. Further, because end optical element 191 is a parallel plane plate free of refractive power, end optical element 191 can be easily exchanged, for example, even in the case when contaminated matters in liquid Lq1 adhere on lower surface 191*a* of end optical element 191.

In the case exchange of end optical element 191 is not taken into consideration, end optical element 191 can be a lens that has refractive power.

According to exposure apparatus 100 of the present embodiment, good exposure of high accuracy to wafer W and the linewidth controllability is performed, precision is preferable, and a pattern of reticle R is copied by each shot area in wafer W. Further, in exposure apparatus 100 of the embodiment, by performing exposure with high resolution and a larger depth of focus than in the air by means of the liquid immersion exposure, the pattern of reticule R can be transferred with good precision on the wafer, and for example, transfer of a fine pattern that has a device rule of around 45 to 100 nm can be achieved using the ArF excimer laser beam.

Incidentally, in the embodiment above, the case has been described where main controller 50 predicts the variation of optical properties of optical system PLL due to the energy absorption of liquid Lq2, using formula (5) which includes the irradiation amount (energy information) of illumination light IL obtained using integrator sensor 46 or the like as a parameter, however, the present invention is not limited to this. For example, instead of formula (4) and formula (5), in each right-hand side, adding to or instead of the right-hand side of formula (4) and formula (5), a model formula that includes at least one of a parameter related to the temperature of liquid Lq2 and a parameter related to the transmittance of liquid Lq2 to illumination light IL can be used. As the parameter related to the transmittance of liquid Lq2 to illumination light IL, the dissolved oxygen concentration in liquid Lq2 which affects the transmittance of liquid Lq2 can be used.

For example, as the parameter related to the temperature of liquid Lq2, the detection values of temperature sensors 62 and 63 can be employed. Further, as the parameter related to the transmittance of liquid Lq2, measurement values of oximeter 64 can be employed. Further, the parameter related to the transmittance of liquid Lq2 is not limited to the dissolved oxygen concentration of liquid Lq2, and other parameters (such as TOC) that may affect the transmittance of liquid Lq2 can be included in the model formula. Incidentally, temperature sensors 62 and 63 are installed in the second space K2 in exposure apparatus 100 of the embodiment, however, in the case of predicting the variation of the optical properties of optical system PLL based on the irradiation amount of illumination light IL which is obtained using integrator sensor 46 as is described above, temperature sensors 62 and 63 arranged in the second space K2 can be omitted.

Further, in the case the variation of the transmittance of liquid Lq2 is not taken into consideration (for example, when replacement of liquid Lq2 is constantly performed using second liquid supply unit 72 and second liquid recovery unit 73), oximeter 64 arranged in the second space K2 can be omitted.

Incidentally, main controller 50 can monitor the difference of temperature in the right and left of liquid Lq2 (one side and the other side of the Y-axis direction), based on the detection values of temperature sensors 62 and 63, and can correct a 1θ component of the wavefront aberration of optical system PLL due to the temperature difference if necessary. As shown in FIG. 4, a catodioptric system is used in the embodiment as projection optical system PL, so that illumination light IL passes a position deflected to the −Y-direction with respect to optical axis AX3 in the second space K2, and a difference of temperature may occur between liquid Lq2 on the −Y side of optical axis AX3 and liquid Lq2 on the +Y side in the second space K2, however, since main controller 50 can detect such temperature difference using temperature sensors 62 and 63, aberration of optical system PLL due to such temperature difference can be corrected.

Incidentally, since liquid Lq1 inside the first space K1 is replaced constantly in the embodiment above, wafer W is exposed without taking into consideration the irradiation variation of the optical properties of optical system PLL due to the illumination light absorption (energy absorption) of liquid Lq1, however, in the case, for example, when replacement of liquid Lq1 in first space K1 is performed regularly, and/or when absorption of illumination light of liquid Lq1 is great, the irradiation variation of the optical properties of optical system PLL due to the illumination light absorption of liquid Lq1 can be taken into consideration. In this case, similar to liquid Lq2, a model formula can furthermore be prepared to predict the variation of the optical properties of optical system PLL due to the illumination light absorption of liquid Lq1.

Further, in the case the dissolved oxygen concentration of liquid Lq1 fluctuates, making the transmittance of liquid Lq1 to the illumination light IL fluctuate, at least one of adjustment of the optical properties of optical system PLL and dose control to wafer W can be performed, taking into consideration the transmittance (dissolved oxygen concentration) of liquid Lq1.

Further, in the case of taking into consideration at least one of the illumination light absorption of liquid Lq1 and the transmittance of liquid Lq1, at least one of a temperature sensor which measures the temperature of liquid Lq1 and an oximeter which detects the dissolved oxygen concentration of liquid Lq1 can be placed in the vicinity of space K1 or the like.

Further, in the embodiment above, the case has been described where wafer W is placed at the beam emitting side of end optical element 191 constituting at least a part of the optical system and at least the optical path (beam path) of illumination light IL among the second space K2 on the beam entering side of the end optical element is filled with liquid Lq2, and the first space K1 between end optical element 191 and wafer W is also filled with liquid Lq1. However, it is a matter of course that the present invention is not limited to this. For example, only the first space K1 between end optical element 191 and wafer W can be filled with liquid such as, for example, purified water. In this case, main controller 50 can use a model formula which includes energy information as a parameter different from formula (5) to predict the variation of the optical properties of optical system PLL due to the illumination light absorption (energy absorption) by the liquid.

Further, also in this case, at least one of adjustment of optical properties of optical system PLL and dose control to wafer W can be performed, taking into consideration the transmittance (dissolved oxygen concentration) of liquid Lq1, or in the case at least one of the illumination light absorption by liquid Lq1 and the transmittance of liquid Lq1 is taken into consideration, at least one of a temperature sensor which measures the temperature of liquid Lq1 and an oximeter which detects the dissolved oxygen concentration of liquid Lq1 can be placed in the vicinity of space K1.

Further, in the embodiment, as in the preparatory operation of irradiation amount measurement previously described, the energy intensity of illumination light IL which has passed through optical system PLL can be measured by a predetermined timing, and based on the measurement results, of at least the section of formula (5) included in formula (3) previously described, $I_0/I_1$ (that is, the transmittance of the optical system) which is the base for calculating irradiation amount $P_{EXP}$ per unit time, or consequently, formula (5) which uses transmittance can be updated. In such a case, it becomes possible to reflect the temporal change of the optical system transmittance in the calculation of the irradiation variation of the image-forming characteristics.

In the embodiment above, the same purified water is supplied as liquids Lq1 and Lq2, however, the quality of the purified water supplied to the first space (liquid Lq1) and the quality of the purified water supplied to the second space (liquid Lq2) can differ. The quality of the purified water includes, for example, temperature uniformity, temperature stability, specific resistance value, TOC (Total Organic Carbon) value, and the like.

For example, the quality of the purified water supplied to the first space K1 close to the image plane of projection optical system PL may be higher than the quality of purified water supplied to the second space K2. Further, a different type of liquid may be supplied to the first space and the second space so that liquid Lq1 that fills the first space K1 and liquid Lq2 that fills the second space K2 are of a different kind. For example, the second space K2 can be filled with a predetermined liquid other than the purified water, such as fluorinated oil. Since oil is a liquid that has a low probability of bacteria growth, the degree of cleanliness in the second space K2 or in the passage where liquid Lq2 (fluorinated oil) flows can be maintained.

Further, both liquids Lq1 and Lq2 can be a liquid other than water. For example, in the case the light source of illumination light IL is the $F_2$ laser beam, because the $F_2$ laser beam does not have any transmittance to water, liquid Lq1 and liquid Lq2 may be fluorinated fluid such as perfluoropolyether (PFPE) or fluorinated oil that can transmit the F2 laser beam. In this case, on the section that comes into contact with liquid Lq1 and liquid Lq2, for example, lyophilization treatment is performed, by forming a thin film with a material containing fluorine that has a molecular structure of small polarity. Further, as liquids Lq1 and Lq2, besides the liquids above, it is also possible to use material that has high transmittance to illumination light IL, a refractive index as high as possible, and stability to projection optical system PL and the photoresist coated on the surface of wafer W (for example, cederwood oil). And, also in this case, the surface treatment is performed, depending on the polarity of liquid Lq1 and liquid Lq2.

In the immersion exposure apparatus described above, a case may occur where the numerical aperture NA of the projection optical system is 0.9 to 1.3. In such a case where numerical aperture NA becomes large, a case may occur of the image-forming characteristics deteriorating due to the polarization effect of the random polarized light conventionally used as the exposure light, therefore, polarization illumination is preferably used. In this case, linear polarization illumination should be performed in the longitudinal direction of the line pattern of the line-and-space mark on the mask (reticle), and from the pattern of the mask (reticle), a large amount of diffracted light that has an S polarization component (TE polarization component), or in other words, diffracted light whose polarization direction component is in line with the longitudinal direction of the line pattern, should be emitted. In the case the space between projection optical system PL and the resist coated on the surface of wafer W is filled with liquid, the transmittance on the surface of the resist of the diffracted light with the S polarization component (TE polarization component), which contributes to improving contrast, becomes high when compared with when the space between projection optical system PL and the resist coated on the surface of wafer W is filled with air (gas), which allows a high image-forming quality even in the case when numerical aperture NA exceeds 1.0. In addition, it is further effective when appropriately combining, for example, a phase shift mask and/or an oblique illumination method (especially, the dipole illumination method) or the like in line with the longitudinal direction of the line pattern as is disclosed in, Kokai (Japanese Unexamined Patent Application Publication) No. 6-188169 bulletin.

Further, not only is the linear polarization illumination (S polarization illumination) in line with the longitudinal direction of the liner pattern of the mask (reticle) effective, but as is disclosed in Kokai (Japanese Unexamined Patent Application Publication) No. 6-53120 bulletin and the like, a combination of a polarization illumination method in which linear polarization is performed in a tangent (circumference) direction with the optical axis serving as the center and the oblique illumination method is also effective. As long as the national laws in designated states (or elected states), to which this international application is applied, permit, the above disclosure of the publication is incorporated herein by reference.

Incidentally, in the embodiment above, a catodioptric system is employed as projection optical system PL, however, a refraction system that does not include a reflective element can also be employed. Further, as projection optical system PL, a catadioptric system disclosed in, for example, U.S. Pat. No. 6,636,350, U.S. Pat. No. 6,873,476, or U.S. Patent Application 2004/0160666 can also be used. As long as the national laws in designated states (or elected states), to which this international application is applied, permit, the above disclosures of each U.S. patent and the U.S. patent application are incorporated herein by reference.

Further, in the embodiment above, as the optical properties of optical system PLL, the irradiation variation of not only focus but also magnification, distortion and the like is predicted and adjusted, however, the prediction and adjustment can be performed selecting at least one of the optical properties as necessary.

Incidentally, in the embodiment above, the case has been described where the present invention is applied to a scanner (scanning exposure apparatus). However, the present invention is not limited to this, and the present invention can be applied to an exposure apparatus of a static exposure type such as the exposure apparatus by the step-and-repeat method (stepper), to an exposure apparatus by the step-and-stitch method, or to an exposure apparatus by the proximity method as long as exposure is performed via a liquid immersion area. In this case as well, irradiation variation calculation of the image-forming characteristics of the optical system and adjustment should be performed as in the embodiment described above. However, in the case of an exposure apparatus by the proximity method that does not have a projection optical system, the liquid which forms a liquid immersion area is equivalent to an optical system.

Further, the present invention can also be applied to a multi-stage type exposure apparatus that has a plurality of wafer stages for holding a wafer like the ones disclosed in Kokai (Japanese Patent Unexamined Application Publication) No. 10-163099 bulletin, Kokai (Japanese Patent Unexamined Application Publication) No. 10-214783 bulletin (corresponding U.S. Pat. Nos. 6,341,007, 6,400,441, 6,549,269, and 6,590,634), Kohyo (Japanese Patent Unexamined Application Publication) No 2000-505958 bulletin (corresponding U.S. Pat. No. 5,969,441), or in U.S. Pat. No. 6,208,407 and the like. Further, the present invention can also be applied to an exposure apparatus equipped with a measurement stage separately from wafer stage WST, as is disclosed in Kokai (Japanese Patent Unexamined Application Publication) No. 2000-164504 bulletin (corresponding U.S. Pat. No. 6,897,963) and the like. In this case, irradiance monitor 58 and uneven illuminance measuring sensor 21P can be arranged on the measurement stage. As long as the national laws in designated states (or elected states), to which this international application is applied, permit, the above disclosures of each Kokai publication and the U.S. patents are incorporated herein by reference.

In the embodiment above, the exposure apparatus is employed whose space between projection optical system PL and wafer W is locally filled with liquid, however, the present invention is also applicable to a liquid immersion exposure apparatus in which exposure is performed in a state where the entire surface of the wafer subject to exposure is soaked in liquid whose details are disclosed in, for example, Kokai (Japanese Unexamined Patent Publication) No. 6-124873 bulletin, Kokai (Japanese Unexamined Patent Publication) No. 10-303114 bulletin, and U.S. Pat. No. 5,825,043 and the like.

As long as the national laws in designated states (or elected states), to which this international application is applied, permit, the above disclosures of each Kokai publication and the U.S. patent are incorporated herein by reference.

Incidentally, in the embodiment described above, a transmittance type mask, which is a transmissive substrate on which a predetermined light shielding pattern (or a phase pattern or a light attenuation pattern) is formed, was used, however, instead of this mask, as is disclosed in, for example, U.S. Pat. No. 6,778,257, an electronic mask that forms a transmission pattern, a reflection pattern, or an emission pattern, based on the electronic data of the pattern that should be exposed can be used. As long as the national laws in designated states (or elected states), to which this international application is applied, permit, the above disclosure of the U.S. patent is incorporated herein by reference.

Further, the present invention can also be applied to an exposure apparatus (lithography system) that forms line-and-space patterns on wafer W by forming interference fringes on wafer W, as is disclosed in, for example, the pamphlet of International Publication WO2001/035168. As long as the national laws in designated states (or elected states), to which this international application is applied, permit, the above disclosure of the international publication pamphlet is incorporated herein by reference.

The use of the exposure apparatus is not limited only to the exposure apparatus for manufacturing semiconductor devices, but the present invention can also be widely applied to an exposure apparatus for transferring a liquid crystal display device pattern onto a rectangular glass plate and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Further, the light source of the exposure apparatus in the embodiment above is not limited to the ArF excimer laser, and a pulsed laser light source such as a KrF excimer laser (output wavelength 248 nm), an F2 laser (output wavelength 157 nm), an Ar2 laser (output wavelength 126 nm), or a Kr2 laser (output wavelength 146 nm), or an ultra high-pressure mercury lamp that generates a bright line such as the g-line (wavelength 436 nm) or the i-line (wavelength 365 nm) can also be used as the light source. Further, a harmonic generation unit of the YAG laser can also be used.

Besides the units described above, a harmonic wave may also be used that is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a nonlinear optical crystal. Further, the projection optical system is not limited to a reduction system, and the system may be either an equal magnifying system or a magnifying system.

Incidentally, the exposure apparatus in each embodiment described above can be made, by incorporating the illumination optical system made up of a plurality of lenses and the projection optical system into the main body of the exposure apparatus, and along with the optical adjustment operation, parts such as the reticle stage and the wafer stage made up of multiple mechanical parts are also attached to the main body of the exposure apparatus and the wiring and piping connected. And then, total adjustment (such as electrical adjustment and operation check) is performed, which completes the making of the exposure apparatus. Incidentally, the making of the exposure apparatus is preferable performed in a clean room where the temperature, the degree of cleanliness and the like is controlled.

Incidentally, semiconductor devices are manufactured through the following steps: a step where the function/performance design of a device is performed; a step where a reticle based on the design step is manufactured; a step where a wafer is manufactured using silicon materials; a coating process where a sensitive material such as a resist is coated on an object such as a wafer; an exposure process where an object such as a wafer on which a sensitive material has been coated by the liquid immersion exposure previously described is exposed using the exposure apparatus in the embodiment described above; a lithography step that includes a developing process where a wafer after the exposure is developed; a device assembly step (including processes such as dicing process, bonding process, and packaging process); inspection step, and the like. In this case, in the lithography step, because the device pattern is formed on the object executing the liquid immersion exposure method previously described using the exposure apparatus in the embodiment above, high integration devices can be manufactured with good yield.

INDUSTRIAL APPLICABILITY

As is described above, the exposure method and the exposure apparatus of the present invention are suitable to expose an object. The device manufacturing method of the present invention is suitable for manufacturing microdevices.

What is claimed is:

1. An exposure method in which an energy beam is irradiated on an object via an optical system including a liquid and the object is exposed, the method comprising:
a process in which a variation of optical properties of the optical system due to an energy absorption of the liquid and a variation of a transmittance of the liquid to the energy beam is predicted, based on energy information of the energy beam which is incident on the liquid and information on the transmittance of the liquid to the energy beam, the energy information of the energy beam being detected via a sensor that detects the energy beam before the energy beam is incident on the liquid; and
a process in which an exposure operation of the object is performed, based on a result of the prediction of the variation of the optical properties of the optical system due to the energy absorption of the liquid and the variation of the transmittance of the liquid to the energy beam.

2. The exposure method according to claim 1 wherein
in the process to predict the variation of the optical properties of the optical system, the variation of the optical properties of the optical system due to the energy absorption of the liquid and the variation of the transmittance of the liquid to the energy beam is predicted using a first formula of computation which includes the energy information as a parameter.

3. The exposure method according to claim 2 wherein
the first formula of computation includes a parameter related to a temperature of the liquid.

4. The exposure method according to claim 2 wherein
the first formula of computation includes a parameter related to the transmittance of the liquid to the energy beam.

5. The exposure method according to claim 4 wherein
the parameter related to the transmittance of the liquid includes a parameter related to a variation of the transmittance of the liquid due to a change of dissolved oxygen concentration in the liquid.

6. The exposure method according to claim 4 wherein
an integrated exposure amount with respect to the object is controlled, based on the transmittance of the liquid.

7. The exposure method according to claim 2 wherein
a measurement of an energy intensity of the energy beam which has passed through the optical system is performed at a predetermined timing, and
the first formula of computation is updated based on a result of the measurement.

8. The exposure method according to claim 2 wherein
the optical system includes an optical element through which the energy beam passes, and
in the process to predict the variation of the optical properties of the optical system, a variation of the optical properties of the optical system due to an energy absorption of the optical element is also predicted using a second formula of computation, which includes the energy information as a parameter, different from the first formula of computation.

9. The exposure method according to claim 1 wherein
in the process to predict the variation of the optical properties of the optical system, the variation of the optical properties of the optical system is predicted, based on at least one of the transmittance of the liquid to the energy beam and a temperature of the liquid.

10. The exposure method according to claim 1 wherein
the optical system includes an optical element through which the energy beam passes, and
the variation prediction of the optical properties of the optical system is performed taking into consideration an energy absorption of the optical element.

11. The exposure method according to claim 1 wherein
the object is placed on a beam emitting side of an optical element that constitutes at least a part of the optical system, and
a beam path on the beam entering side of the optical element is filled with the liquid.

12. The exposure method according to claim 11 wherein
a space between the optical element and the object is filled with a second liquid that is a dissimilar kind of liquid or a same kind of but different liquid from the liquid filling the beam path on the beam entering side of the optical element.

13. The exposure method according to claim 12 wherein
in the process to predict the variation of the optical properties of the optical system, a variation of the optical properties of the optical system due to an energy absorption of the second liquid filling the space between the optical element and the object is also predicted, using a third formula of computation, which includes the energy information as a parameter, different from a first formula of computation used to predict the variation based on the energy information of the energy beam which is incident on the liquid and the information on the transmittance of the liquid to the energy beam.

14. The exposure method according to claim 1 wherein
when an irradiated liquid on which the energy beam has been irradiated is replaced with a non-irradiated liquid on which the energy beam has not been irradiated,
it is regarded that there is no variation of the optical properties of the optical system due to an energy absorption of any liquid in a path of the energy beam.

15. A device manufacturing method including a lithography process in which an object is exposed using the exposure method according to claim 1 to form a device pattern on the object.

16. The exposure method according to claim 1, wherein
the process to predict the variation of the optical properties of the optical system includes
predicting a first variation of the optical properties of the optical system due to the energy absorption of the liquid, based on the energy information, and
predicting a second variation of the optical properties of the optical system due to an energy absorption of components of the optical system excluding the liquid, based on the energy information, and
in the process to perform the exposure operation, the exposure operation of the object is performed based on results of the predictions of the first variation and the second variation of the optical properties of the optical system.

17. The exposure method according to claim 16, wherein
the liquid includes a liquid disposed in a space above an end of the optical system.

18. An exposure apparatus that irradiates an energy beam on an object via a liquid and exposes the object, the apparatus comprising:
an optical system that includes the liquid;
a sensor system that acquires energy information of the energy beam incident on the liquid, the sensor system detecting the energy beam before the energy beam is incident on the liquid; and
a control unit that performs a prediction of a variation of optical properties of the optical system including the liquid due to an energy absorption of the liquid and a variation of a transmittance of the liquid to the energy beam, based on the energy information acquired using the sensor system and information on the transmittance of the liquid to the enemy beam, and controls an exposure operation to the object, based on a result of the prediction of the variation of the optical properties of the optical system due to the energy absorption of the liquid and the variation of the transmittance of the liquid to the energy beam.

19. The exposure apparatus according to claim 18 wherein
the control unit performs the prediction of the variation of the optical properties of the optical system due to the energy absorption of the liquid and the variation of the transmittance of the liquid to the energy beam using a first formula of computation which includes the energy information as a parameter.

20. The exposure apparatus according to claim 19 wherein
the first formula of computation includes a parameter related to a temperature of the liquid.

21. The exposure apparatus according to claim 19 wherein
the first formula of computation includes a parameter related to the transmittance of the liquid to the energy beam.

22. The exposure apparatus according to claim 21 wherein
the parameter related to the transmittance of the liquid includes a parameter related to a variation of the transmittance of the liquid due to a change of a dissolved oxygen concentration in the liquid.

23. The exposure apparatus according to claim 22, the apparatus further comprising:
an oximeter that measures the dissolved oxygen concentration in the liquid.

24. The exposure apparatus according to claim 21 wherein
the control unit controls an integrated exposure amount to the object based on the transmittance of the liquid.

25. The exposure apparatus according to claim 19, the apparatus further comprising:
an illumination system that illuminates a predetermined pattern using the energy beam so as to project an image of the predetermined pattern on the object via the optical system, wherein
the control unit sets the first formula of computation for every illumination condition with respect to the predetermined pattern.

26. The exposure apparatus according to claim 19 wherein
the optical system includes an optical element through which the energy beam passes, and
the control unit also predicts a variation of the optical properties of the optical system due to an energy absorption of the optical element using a second formula of computation, which includes the energy information as a parameter, different from the first formula of computation.

27. The exposure apparatus according to claim 18 wherein
the control unit predicts the variation of the optical properties of the optical system, based on at least one of the transmittance of the liquid to the energy beam and a temperature of the liquid.

28. The exposure apparatus according to claim 18 wherein
the optical system includes an optical element through which the energy beam passes, and the control unit performs a prediction of a variation of the optical properties of the optical system also taking into consideration an energy absorption of the optical element.

29. The exposure apparatus according to claim 18 wherein the object is placed on a beam emitting side of an optical element that constitutes at least a part of the optical system, and
a beam path on the beam entering side of the optical element is filled with the liquid.

30. The exposure apparatus according to claim 29 wherein a space between the optical element and the object is filled with a second liquid that is a dissimilar kind of liquid or a same kind of but different liquid from the liquid filling the beam path on the beam entering side of the optical element.

31. The exposure apparatus according to claim 30 wherein the control unit also predicts a variation of the optical properties of the optical system due to an energy absorption of the second liquid filling the space between the optical element and the object using a third formula of computation, which includes the energy information as a parameter, different from a first formula of computation used to predict the variation based on the energy information of the energy beam which is incident on the liquid and the information on the transmittance of the liquid to the energy beam.

32. The exposure apparatus according to claim 18, the apparatus further comprising:
a liquid immersion mechanism that can supply the liquid.

33. The exposure apparatus according to claim 32 wherein the control unit replaces an irradiated liquid on which the energy beam has been irradiated with a non-irradiated liquid on which the energy beam has not been irradiated by controlling the liquid immersion mechanism, and when the liquid immersion mechanism replaces the irradiated liquid with the non-irradiated liquid, it is regarded that there is no variation of the optical properties of the optical system due to an energy absorption of any liquid in a path of the energy beam.

34. The exposure apparatus according to claim 18, the apparatus further comprising:
a beam source that emits the energy beam, whereby the sensor system has a branching unit which branches off a part of the energy beam between the beam source and the optical system and a sensor element on which an energy beam branched by the branching unit is incident.

35. A device manufacturing method including a lithography process in which an object is exposed using the exposure apparatus according to claim 18 to form a device pattern on the object.

36. The exposure apparatus according to claim 18, wherein when performing the prediction of the variation of the optical properties of the optical system, the control unit individually performs a prediction of a first variation of the optical properties of the optical system including the liquid due to the energy absorption of the liquid and performs a prediction of a second variation of the optical properties of the optical system due to energy absorption of components of the optical system excluding the liquid, based on the energy information, and controls the exposure operation to the object based on results of the predictions of the first variation and the second variation of the optical properties of the optical system.

37. The exposure apparatus according to claim 36, wherein the liquid includes a liquid disposed in a space above an end of the optical system.

38. A device manufacturing method including a lithography process in which an object is exposed by irradiating an energy beam on the object via an optical system including a liquid to form a device pattern on the object, the method comprising:
a process in which a variation of optical properties of the optical system due to an energy absorption of the liquid and a variation of a transmittance of the liquid to the energy beam is predicted, based on energy information of the energy beam which is incident on the liquid and information on the transmittance of the liquid to the energy beam, the energy information of the energy beam being detected via a sensor that detects the energy beam before the energy beam is incident on the liquid; and
a process in which an exposure operation of the object is performed, based on a result of the prediction of the variation of the optical properties of the optical system due to the energy absorption of the liquid and the variation of the transmittance of the liquid to the energy beam.

39. The device manufacturing method according to claim 38, wherein
the process to predict the variation of the optical properties of the optical system includes
predicting a first variation of the optical properties of the optical system due to the energy absorption of the liquid, based on the energy information; and
predicting a second variation of the optical properties of the optical system due to an energy absorption of components of the optical system excluding the liquid, based on the energy information, and
in the process to perform the exposure operation, the exposure operation of the object is performed based on results of the predictions of the first variation and the second variation of the optical properties of the optical system.

40. The device manufacturing method according to claim 39, wherein
the liquid includes a liquid disposed in a space above an end of the optical system.

41. A device manufacturing method including a lithography process in which an object is exposed by irradiating an energy beam on the object via an optical system including a liquid to form a device pattern on the object, the method comprising:
a process in which energy information of the energy beam which is incident on the liquid is acquired, using a sensor system;
a process in which a variation of optical properties of the optical system including the liquid due to an energy absorption of the liquid and a variation of a transmittance of the liquid to the energy beam is predicted based on the energy information acquired using the sensor system and information on the transmittance of the liquid to the energy beam, the sensor system detecting the energy beam before the energy beam is incident on the liquid; and
a process in which an exposure operation of the object is performed, based on a result of the prediction of the variation of the optical properties of the optical system due to the energy absorption of the liquid and the variation of the transmittance of the liquid to the energy beam.

42. The device manufacturing method according to claim 41, wherein
the process to predict the variation of the optical properties of the optical system includes predicting a first variation of the optical properties of the optical system due to the energy absorption of the liquid, based on the energy information; and predicting a second variation of the optical properties of the optical system due to an energy absorption of components of the optical system excluding the liquid, based on the energy information, and in the process to perform the exposure operation, the exposure operation of the object is performed based on results of the predictions of the first variation and the second variation of the optical properties of the optical system.

43. The device manufacturing method according to claim 42, wherein the liquid includes a liquid disposed in a space above an end of the optical system.

* * * * *